United States Patent
Shigaki et al.

(10) Patent No.: US 8,022,293 B2
(45) Date of Patent: Sep. 20, 2011

(54) DYE-SENSITIZED PHOTOELECTIC CONVERSION DEVICES

(75) Inventors: Koichiro Shigaki, Kita-ku (JP); Teruhisa Inoue, Kita-ku (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 1189 days.

(21) Appl. No.: 11/661,843

(22) PCT Filed: Sep. 6, 2005

(86) PCT No.: PCT/JP2005/016328
§ 371 (c)(1),
(2), (4) Date: Mar. 5, 2007

(87) PCT Pub. No.: WO2006/028087
PCT Pub. Date: Mar. 16, 2006

(65) Prior Publication Data
US 2008/0067476 A1 Mar. 20, 2008

(30) Foreign Application Priority Data
Sep. 8, 2004 (JP) .................................. 2004-261136

(51) Int. Cl.
*H01L 31/0216* (2006.01)
(52) U.S. Cl. ........ 136/263; 136/256; 136/250; 429/111; 257/431
(58) Field of Classification Search .................. 136/263, 136/256, 250; 429/111; 257/431
See application file for complete search history.

(56) References Cited

U.S. PATENT DOCUMENTS

| | | |
|---|---|---|
| 2,803,640 A | 8/1957 | Heckert |
| 4,927,721 A | 5/1990 | Gratzel et al. ................. 429/111 |
| 5,084,365 A | 1/1992 | Gratzel et al. ................. 429/111 |
| 5,670,091 A | 9/1997 | Marder et al. |
| 6,084,176 A * | 7/2000 | Shiratsuchi et al. .......... 136/263 |
| 6,291,763 B1 | 9/2001 | Nakamura |
| 6,335,481 B1 | 1/2002 | Watanabe |
| 6,376,765 B1 | 4/2002 | Wariishi et al. |
| 7,141,735 B2 | 11/2006 | Ikeda et al. .................... 136/263 |
| 7,728,222 B2 | 6/2010 | Ikeda et al. |
| 7,851,701 B2 | 12/2010 | Ikeda et al. |
| 7,977,570 B2 | 7/2011 | Shigaki et al. |
| 2002/0010969 A1 | 1/2002 | Goettel et al. |
| 2003/0152827 A1 | 8/2003 | Ikeda et al. |
| 2004/0074532 A1 | 4/2004 | Ikeda et al. |
| 2004/0099306 A1 | 5/2004 | Hara et al. |
| 2004/0187918 A1 | 9/2004 | Ikeda et al. .................... 136/263 |
| 2006/0130249 A1 | 6/2006 | Ikeda et al. |
| 2007/0191455 A1 | 8/2007 | Hiyoshi et al. |
| 2008/0067476 A1 | 3/2008 | Shigaki et al. |
| 2008/0087327 A1 | 4/2008 | Horiuchi et al. ............. 136/265 |

FOREIGN PATENT DOCUMENTS

| | | |
|---|---|---|
| CN | 1861740 | 11/2006 |
| EP | 0 566 077 A2 | 10/1993 |
| EP | 0 566 081 A2 | 10/1993 |
| EP | 0 566 082 A1 | 10/1993 |
| EP | 0 692 800 | 1/1996 |
| EP | 0 892 411 A2 | 1/1999 |
| EP | 0 911 841 | 4/1999 |
| EP | 0 924 724 A2 | 6/1999 |
| EP | 1 075 005 A2 | 2/2001 |
| EP | 1 311 001 A1 | 5/2003 |
| EP | 1 339 129 A1 | 8/2003 |
| EP | 1 422 782 | 5/2004 |
| EP | 1 628 356 A1 | 2/2006 |
| JP | 48-3115 | 1/1973 |
| JP | 08-081222 | 3/1996 |

(Continued)

OTHER PUBLICATIONS

Nature, vol. 353, p. 737 (1991); B. O'Regan and M.Gratzel; "A low-cost, high-efficiency solar cell based on dye-sensitized colloidal TiO2 films".

(Continued)

*Primary Examiner* — Ling Choi
(74) *Attorney, Agent, or Firm* — Nields, Lemack & Frame, LLC

(57) ABSTRACT

The present invention relates to photoelectric conversion devices, characterized by using oxide semiconductor particles sensitized with a methine dye represented by the Formula (1):
(KA 1)

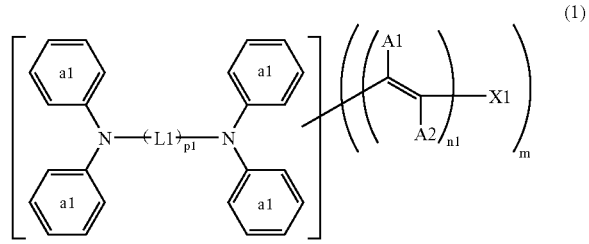

(in the Formula (1), m represents 1 to 4; n1 represents 1 to 7; p1 represents 1 to 4; X1 represents an optionally substituted aromatic residue, an optionally substituted aliphatic hydrocarbon residue, a cyano group, a phosphoric acid group, a sulfonic acid group, or a carboxyl group, a carbonamide group, and the like; L1 represents an optionally substituted aromatic residue and the like; A1 and A2 each independently represent an optionally substituted aromatic residue, a hydroxyl group, a phosphoric acid group, a cyano group, a hydrogen atom, a halogen atom and the like; the ring a1 has 1 or a plurality of halogen atoms, amide groups, hydroxyl groups, cyano groups, nitro groups, alkoxy groups, acyl groups and the like.), and solar cells made by using the same. The devices and the cells are characterized by relatively low cost, high stability, and high photoelectric conversion efficiency.

17 Claims, No Drawings

FOREIGN PATENT DOCUMENTS

| JP | 26644194 | | 6/1997 |
|---|---|---|---|
| JP | 11-067285 | | 3/1999 |
| JP | 11-158395 | | 6/1999 |
| JP | 11-163378 | | 6/1999 |
| JP | 11-176489 | | 7/1999 |
| JP | 11-214731 | | 8/1999 |
| JP | 2000-26487 | A | 1/2000 |
| JP | 2000-195569 | | 7/2000 |
| JP | 2000-223167 | | 8/2000 |
| JP | 2000-268892 | A | 9/2000 |
| JP | 2000-285977 | | 10/2000 |
| JP | 2000-285978 | | 10/2000 |
| JP | 2001-042524 | | 2/2001 |
| JP | 2001-052766 | | 2/2001 |
| JP | 2001-064529 | | 3/2001 |
| JP | 2002-164089 | | 6/2002 |
| JP | 2003-59547 | A | 2/2003 |
| JP | 2004-22222 | A | 1/2004 |
| JP | 2004-146421 | * | 5/2004 |
| JP | 2004-207224 | A | 7/2004 |
| JP | 2004-227825 | | 8/2004 |
| JP | 2004-227825 | A | 8/2004 |
| JP | 2005-5026 | A | 1/2005 |
| JP | 2005-11800 | A | 1/2005 |
| JP | 2005-19251 | A | 1/2005 |
| JP | 2005-123013 | A | 5/2005 |
| JP | 2005-129329 | A | 5/2005 |
| JP | 2005-129429 | A | 5/2005 |
| JP | 2005-129430 | A | 5/2005 |
| JP | 2005-209682 | A | 8/2005 |
| JP | 2005-227376 | A | 8/2005 |
| JP | 2006-93284 | A | 4/2006 |
| JP | 2006-156212 | A | 6/2006 |
| JP | 2006-188582 | A | 7/2006 |
| JP | 2006-190534 | A | 7/2006 |
| WO | 02/11213 | | 2/2002 |
| WO | 2004/011555 | | 2/2004 |
| WO | 2004/082061 | A1 | 9/2004 |
| WO | 2005/077956 | A1 | 8/2005 |
| WO | 2006/028087 | A1 | 3/2006 |

OTHER PUBLICATIONS

J.Am.Chem.Soc. 1993, vol. 115, p. 6382 (1993); M.K. Nazeeruddin et al.; "Conversion of Light to Electricity by cis-X2Bis(2,2'-bipyridyl-4,4'-dicarboxylate)ruthenium(II) Charge-Transfer Sensitizers (X=Cl-, Br-, I-, CN-, and SCN-) on Nanocrystalline TiO2 Electrodes".
Chemistry Letters, p. 1241 (1998); Wataru Kubo et al.; "Fabrication of Quasi-solid-state Dye-sensitized TiO2 Solar Cells Using Low Molecular Weight Gelators".
The International Search Report dated Dec. 20, 2005.
Supplemental European Search Report dated May 25, 2009.
Solar Energy Materials & Solar Cells 80 (2003) 47-71; K.Sayama et al.; "Efficient Sensitization of nanocrystalline TiO2 films with cyanine and merocyanine organic dyes".
International Search Report dated Sep. 5, 2006 in co-pending U.S. Appl. No. 11/920,899.
Office Action dated Jun. 21, 2010 in co-pending U.S. Appl. No. 11/920,899.
International Search Report dated Sep. 19, 2006 in co-pending U.S. Appl. No. 11/922,062.
Office Action dated Jun. 21, 2010 in co-pending U.S. Appl. No. 11/922,062.
European communication dated Aug. 4, 2010 in co-pending foreign application (EP06757302.2).
Office Action dated Oct. 8, 2010 in co-pending U.S. Appl. No. 11/920,899.
Office Action dated Oct. 13, 2010 in co-pending U.S. Appl. No. 11/922,062.
J. Mater. Chem, 2000, 10, 1-25; Yasuhiko Shirota, "Organic Materials for Electronic and Optoelectronic Devices".
J. Am. Chem. Soc. 2006, 128, p. 16701-16707; Sanghoon Kim et al.; "Molecular Engineering of Organic Sensitizers for Solar Cell Applications".
Thin Solid Films 438-439 (2003) p. 147-152; Keiichi Miyairi et al.; "Photovoltaic properties of double layer devices consisting of titanium dioxide and prophyrin dispersed hole transporting material layer".
Chem Commun., 2004, p. 68-69; Sanghoon Kim et al.; "The role of borole in a fully conjugated electron-rich system".
International Search Report dated Sep. 17, 2002 in a co-pending foreign application.
International Search Report dated May 25, 2004 in a co-pending foreign application.
Supplementary European Search Report dated Feb. 13, 2006 in a co-pending foreign application.
Supplementary European Search Report dated Feb. 21, 2007 in a co-pending foreign application.
International Search Report dated May 22, 2007 in a co-pending foreign application.
International Search Report dated Jun. 4, 2002 in a co-pending foreign application.
European Communication dated Jun. 7, 2010 in a co-pending foreign application.
Office Action dated Sep. 17, 2009 in co-pending U.S. Appl. No. 10/548,858.
Office Action dated May 25, 2010 in co-pending U.S. Appl. No. 10/548,858.
Office Action dated May 7, 2010 in co-pending U.S. Appl. No. 12/224,350.
Final Rejection dated Jan. 25, 2011 in co-pending U.S. Appl. No. 12/224,350.
Machine English translation of JP2004-146421.
Partial translation of JP2004-146421, with verification of translation dated Dec. 27, 2010.
Notice of Allowance dated Mar. 16, 2011 in co-pending U.S. Appl. No. 11/920,899.
Final Rejection dated Mar. 15, 2011 in co-pending U.S. Appl. No. 11/922,062.
Notice of Allowance dated Jun. 22, 2011 in co-pending U.S. Appl. No. 11/922,062.

* cited by examiner

US 8,022,293 B2

DYE-SENSITIZED PHOTOELECTRIC CONVERSION DEVICES

TECHNICAL FIELD

The present invention relates to the photoelectric conversion devices sensitized with an organic dye, and the solar cells made by using the same, in detail, relates to the photoelectric conversion devices characterized by using the oxide semiconductor particles sensitized with a methine dye having a specific skeleton, and the solar cells made by utilizing the same.

BACKGROUND ART

The solar cells utilizing sunlight have been drawn attention as an energy resource to replace a fossil fuel such as petroleum, coal and natural gas or the like. At present, an efficiency enhancement is actively studied on silicon solar cells using crystalline or amorphous silicon, or compound semiconductor solar cells or the like using gallium, arsenic or the like. These solar cells, however, require high energy and cost to produce, and thus there was a problem that it was difficult to use generally.

In addition, the photoelectric conversion devices using dye-sensitized semiconductor particles, or solar cells made by using the same have been known, and a material and a production technology required for preparation thereof have been developed and disclosed (refer to Patent Literature 1, Non-patent Literature 1 and Non-patent Literature 2). These kinds of photoelectric conversion devices are drawn attention because they are produced using relatively inexpensive oxide semiconductors such as titanium oxide, and they have a possibility to yield lower cost photoelectric conversion devices than conventional solar cells using silicon or the like, and also to yield the colorful solar cells.

In the dye-sensitized type photoelectric conversion devices now under development, however, the ruthenium-based complexes are used as sensitizing dyes to obtain the photoelectric conversion devices with high conversion efficiency; cost of the dyes themselves is high and a supply problem is also left. In addition, use of organic dyes as sensitizing dyes is also challenged, however, practical application level has not yet been attained because conversion efficiency, stability and durability are still low, and thus further enhancement of conversion efficiency is desired (refer to Patent Literature 2). Up to now, the preparation examples of photoelectric conversion devices using a methine dye are known, and in addition, relatively many study examples are known on coumarin-based dyes (refer to Patent Literature 3) or melocyanine-based dyes (refer to Patent Literatures 4, 5 and 6), however, further cost reduction and further enhancement of stability and conversion efficiency or the like are also desired thereon.

Patent Literature 1: JP No. 2664194
Patent Literature 2: WO 2002/011213
Patent Literature 3: JP-A-2002-164089
Patent Literature 4: JP-A-8-81222
Patent Literature 5: JP-A-11-214731
Patent Literature 6: JP-A-2001-52766
Non-patent Literature 1: B. O'Regan and M. Graetzel Nature, Vol. 353, p. 737 (1991)
Non-patent Literature 2: M. K. Nazeeruddin, A. Kay, I. Rodicio, R. Humphry-Baker, E. Muller, P. Liska, N. Vlachopoulos, M. Graetzel, J. Am. Chem. Soc., Vol. 115, p. 6382 (1993)
Non-patent Literature 3: W. Kubo, K. Murakoshi, T. Kitamura, K. Hanabusa, H. Shirai, and S. Yanagida, Chem. Lett., p. 1241 (1998)

DISCLOSURE OF THE INVENTION

Problem to be Solved by the Invention

In photoelectric conversion devices using organic dye-sensitized semiconductor particles, the development of the photoelectric conversion devices with high conversion efficiency and high practical applicability using a low cost organic dye and solar cells being capable to use the same have been required.

Means for Solving Problem

The present inventors, after intensive effort to solve the above-described problems, have found that the photoelectric conversion devices with high conversion efficiency and high practical applicability are obtainable by preparation of photoelectric conversion devices having semiconductor particles sensitized with a specific dye, and have thus completed the present invention.

That is, the present invention relates to the following aspects:

(1) The photoelectric conversion devices, characterized by using oxide semiconductor particles sensitized with a methine dye represented by the Formula (1):

(KA 1)

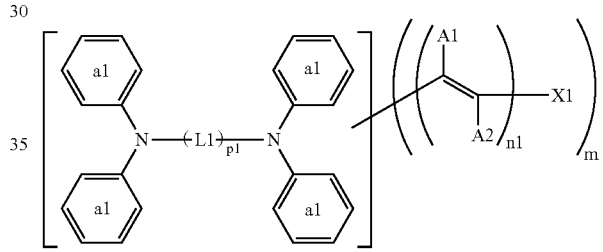

((In the Formula (1), m is an integer of 1 to 4. n1 is an integer of 1 to 7. p1 is an integer of 1 to 4. X1 represents an optionally substituted aromatic residue; an optionally substituted aliphatic hydrocarbon residue; a cyano group; a phosphoric acid group; a sulfonic acid group; or a substituted carbonyl group selected from the group consisting of a carboxyl group, a carbonamide group, an alkoxycarbonyl group and an acyl group. L1 represents an optionally substituted aromatic residue. A1 and A2 each independently represent an optionally substituted aromatic residue, a hydroxyl group, a phosphoric acid group, a cyano group, a hydrogen atom, a halogen atom, an optionally substituted aliphatic hydrocarbon residue, a carboxyl group, a carbonamide group, an alkoxycarbonyl group or an acyl group. In the case where n1 is 2 or larger, and A1 and A2 are present in plural, each of A1 and each of A2 may be the same or different each other. In addition, A1, A2 and X1 may form a ring by any two thereof; in the case where A1 and A2 are present in plural, a ring may be formed by arbitrary two thereof, or by any one of them with X1; the resultant ring may optionally have a substituent. The 4 a1 rings may optionally have 1 or 2 or more substituents selected from the group consisting of a halogen atom, an amide group, a hydroxyl group, a cyano group, a nitro group, an alkoxy group, an acyl group, a substituted or unsubstituted amino group, an optionally substituted aliphatic hydrocarbon residue and an optionally substituted aromatic residue; in the case where a plurality of substituents are present, substituents thereof may form a ring which may optionally have a substituent, by mutually binding themselves, or with the adjacent ring a1 or L1.), (2) The photoelectric conversion devices described in the above (1), wherein the 4 a1 rings each independently represent unsubstituted benzene, or benzene rings substituted with a group selected from the group consisting of a halogen atom, a di(C1 to C4) alkylamino group, a phenyl group, a (C1 to C4) alkyl group, and a unsubstituted or methyl substituted (C6 to C12) aryloxy group as a substituent; and the 2 a1 rings binding to the same nitrogen atom may form a carbazole ring by a single bond together with said nitrogen atom; and at least any one of the 4 a1 rings is substituted with the vinyl group enclosed by ( )m, (3) The photoelectric conversion devices described in the above (1) or (2), wherein the 4 a1 rings are benzene rings which may optionally be substituted with a phenyl group, a methyl group or a dimethylamino group; n1 is 1 to 5; p1 is 1 to 4; L1 is a phenyl group; m is 1 or 2; and in the case where m is 2, the vinyl group enclosed by ( )m is substituted, one by one, with a1 rings at both sides linked by -(L1)-, (4) The photoelectric conversion devices described in the (1) to (3), wherein X1 in the Formula (1) is a carboxyl group, (5) The photoelectric conversion devices described in any one of the (1) to (4), wherein X1 in the Formula (1) is a carboxyl group, and A2 closest to X1 is a cyano group, a carboxyl group or an acyl group, (6) The photoelectric conversion devices described in the (1), wherein X1 in the Formula (1) and A2 closest to X1 form an optionally substituted ring, (7) The photoelectric conversion devices described in the (1) to (6), wherein p1 in the Formula (1) is 1 to 2, (8) The photoelectric conversion devices described in the (1) to (7), wherein m in the Formula (1) is 1 to 2, (9) The photoelectric conversion devices described in the (1) to (8), wherein n1 in the Formula (1) is 1 to 5,

(10) The photoelectric conversion devices described in any one of the (1) to (9), wherein L1 in the Formula (1) is a group selected from the group consisting of the groups represented by the following Formula:

(KA 2)

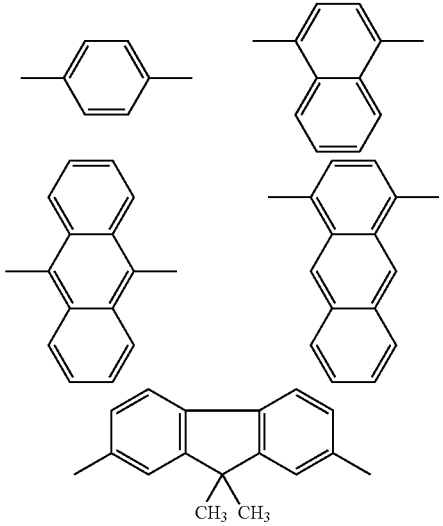

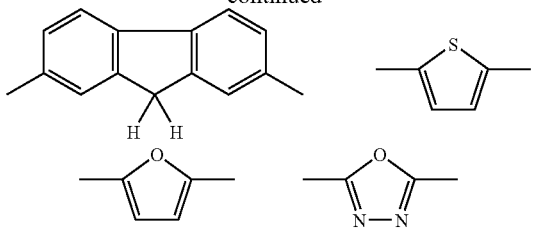

(11) The photoelectric conversion devices described in any one of the (1) to (10), wherein the methine dye represented by the Formula (1) in the above (1) is the methine dye represented by the following Formula (2):

(KA 3)

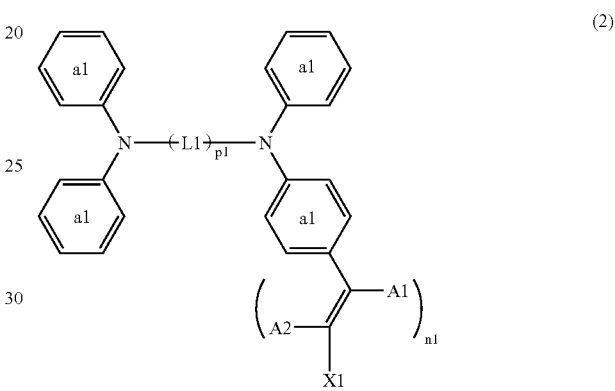

(2)

(In the Formula (2), n1, p1, L1, X1, A1, A2 and ring a1 each represent the same meanings as in the Formula (1).),

(12) The photoelectric conversion devices described in any one of the (1) to (10), wherein the methine dye represented by the Formula (1) in the above (1) is the methine dye represented by the following Formula (3):

(KA 4)

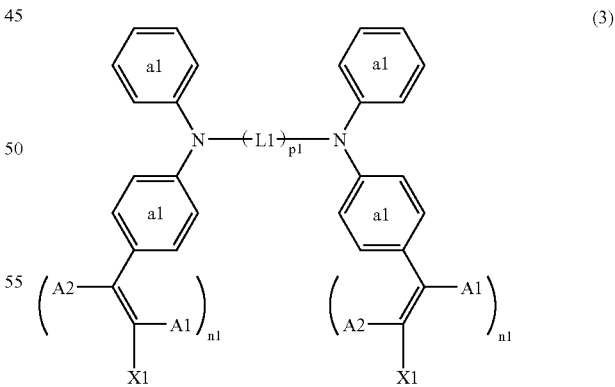

(3)

(In the Formula (3), n1, p1, L1, X1, A1, A2 and a1 ring each represent the same meanings as in the Formula (1)),

(13) The photoelectric conversion devices, characterized by using the oxide semiconductor particles sensitized with 1 or more kinds of the methine dyes represented by the Formula (1) and a metal complex and/or an organic dye having structure other than the Formula (1),

(14) The photoelectric conversion devices described in any one of (1) to (13), wherein the oxide semiconductor particles contain a titanium dioxide, a zinc oxide or a tin oxide, as a metal component,

(15) The photoelectric conversion devices described in any one of (1) to (14), wherein the oxide semiconductor particles sensitized with the methine dye are those obtainable by making the oxide semiconductor particles to support the methine dye represented by the Formula (1), in the presence of a clathrate compound,

(16) The photoelectric conversion devices described in any one of (1) to (15), wherein the oxide semiconductor particles sensitized with the methine dye are those obtainable by making the thin film of the oxide semiconductor particles to support the dye,

(17) The solar cells, characterized by using the photoelectric conversion devices described in any one of (1) to (16),

(18) The photoelectric conversion devices in the above (1), wherein, in the Formula (1), the 4 a1 rings each independently represent unsubstituted benzene, or benzene rings substituted with a group selected from the group consisting of a halogen atom, a di(C1 to C4) alkylamino group, a phenyl group, a (C1 to C4) alkyl group, and a unsubstituted or methyl substituted (C6 to C12) aryloxy group, as the substituent, and the 2 a1 rings binding to the same nitrogen atom may form a carbazole ring by a single bond together with said nitrogen atom, and at least any one of the 4 a1 rings is substituted with the vinyl group enclosed by ( )m, p1 is 1 or 2 and a linking group shown by -(L1)p1- represents a (C6 to C14) divalent aromatic hydrocarbon residue consisting of a single or a plural aromatic rings, n1 is 1 to 5, m is 1 or 2, A1 and A2 independently represent a hydrogen atom; a (C1 to C18) aliphatic hydrocarbon residue; a phenyl group; a hydroxy group; a mercapto group; an amino group which may optionally be substituted with a phenyl group; a carboxyl group; a cyano group; a (C2 to C4) acyl group which may optionally be substituted with 1 to 3 halogeno groups; or a nitro group, adjacent A1 and A2, or A1 and A1, which are adjacent with one space, or A2 and A2, which are adjacent with one space, may form a 5- to 6-membered condensed ring by linking together with the vinyl group, X1 represents a carboxyl group; a phosphoric acid group; a cyano group; a phenyl group having any of a hydroxy group, a carboxyl group, or both thereof, as a substituent; or a 5- to 6-membered condensed ring containing 1 to 2 hetero atoms selected from an oxygen atom, a sulfur atom and a nitrogen atom (said condensed ring may optionally be substituted with a carboxyl group, or a (C1 to C3) alkyl group which may optionally be substituted with a carboxyl group; in addition, said condensed ring may be a condensed ring containing 1 benzene ring); and further, A2 binding to the same carbon atom having X1 binds with X1, and =C(A2)(X1) is a 5- to 6-membered condensed ring which may optionally contain 1 to 2 hetero atoms selected from the group consisting of an oxygen atom, a sulfur atom and a nitrogen atom (said condensed ring may optionally be substituted with an oxygen atom; a sulfur atom; a cyano group; a phenyl group; a carboxyl group; or a (C1 to C3) alkyl group which may optionally be substituted with a carboxyl group; and in addition, said condensed ring may be a condensed ring containing 1 benzene ring,

(19) The photoelectric conversion devices described in the claim (18), wherein the 4 a1 rings each independently represent unsubstituted benzene rings or benzene rings substituted with the vinyl group enclosed by ( )m; at least 1 of the a1 rings is substituted with said vinyl group. The 2 a1 rings binding to the same nitrogen atom may form a carbazole ring by single bond together with said nitrogen atom; p1 is 2; L1 is a phenyl group; n1 is 1 or 2; m is 1 or 2; A1 and A2 independently represent a hydrogen atom, a carboxyl group, and a cyano group; X1 represents a carboxyl group; and further A2 binds with X1 together, and =C(A2)(X1) is a group represented by the Formula B17 or B21 described later.

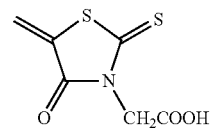

B17

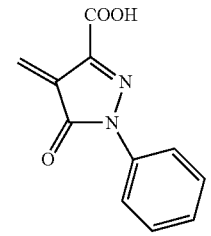

B21

EFFECT OF THE INVENTION

In the dye-sensitized photoelectric conversion devices of the present invention, dye sensitization in high stability and conversion efficiency is carried out by using of a methine dye having the specific structure, and production of solar cells with high stability and conversion efficiency is possible by using said photoelectric conversion devices.

BEST MODE FOR CARRYING OUT THE INVENTION

The present invention is explained in detail below. The dye-sensitized photoelectric conversion devices of the present invention use the oxide semiconductor particles sensitized with the methine dye represented by the following Formula (1):

(KA 5)

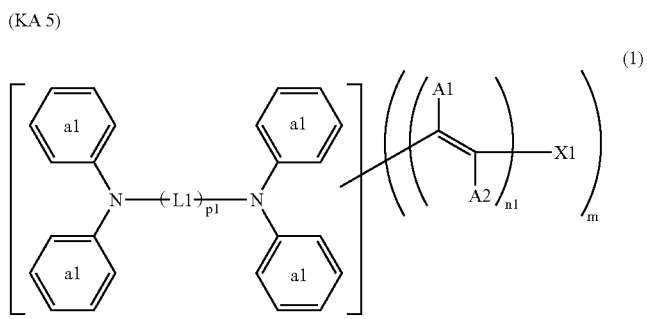

(1)

wherein a1, L1, p1, A1, A2, X1, n1 and m represent the same meaning as in the above.

m in the Formula (1) represents an integer of 1 to 4, preferably 1 to 3 and particularly preferably 1 to 2. n1 in the Formula (1) represents an integer of 1 to 7, preferably 1 to 6 and more preferably 1 to 5. In the Formula (1), p1 represents an integer of 1 to 4, preferably 1 to 3 and particularly preferably 1 to 2.

X1 in the Formula (1) represents an optionally substituted aromatic residue, an optionally substituted aliphatic hydrocarbon residue, a cyano group, a phosphoric acid group, a sulfonic acid group, or a substituted carbonyl group (for example, a carboxyl group, a carbonamide group, an alkoxycarbonyl group, an acyl group or the like). Among these, an optionally substituted aromatic residue, a phosphoric acid group, a sulfonic acid group, a carboxyl group, a carbonamide group, an alkoxycarbonyl group or an acyl group is preferable, and a phosphoric acid group or a carboxyl group is more preferable among these. A carboxyl group is particularly preferable.

In the above description, an aromatic group in "an optionally substituted aromatic residue" means an group eliminated 1 hydrogen atom from the aromatic ring, and the aromatic ring may be a 5- to 6-membered monocycle type aromatic ring or may be the aromatic ring composing of a plurality of, for example, 2 to 3 rings. In addition, the 5- to 6-membered aromatic ring may contain 1 to 3, preferably 1 to 2 hetero atoms selected from the group consisting of an oxygen atom, a sulfur atom and a nitrogen atom, in 1 ring. In the case where the aromatic group is composed of a plurality of aromatic rings, it may be a condensed ring containing a heterocyclic ring containing a hetero atom, preferably 1 to 2 hetero atoms, and 1 to 3, preferably 1 to 2 benzene rings. For example, aromatic hydrocarbon rings such as benzene, naphthalene, anthracene, phenanthrene, pyrene, perylene, terylene, indene and azulene; heterocyclic aromatic rings such as pyridine, pyrazine, pyrimidine, pyrazole, pyrazolidine, thiazolidine, oxazolidine, pyran, chromene, pyrrole, pyrrolidine, benzimidazole, imidazoline, imidazolidine, imidazole, pyrazol, triazole, triazine, diazole, indolin, thiophene, thienothiophene, furan, oxazole, oxadiazole, thiazine, thiazole, indole, benzothiazole, benzothiadiazole, naphthothiazole, benzoxazole, naphthoxazole, indolenine, benzindolenine, pyrazine, quinoline, and quinazoline; condensed aromatic rings such as fluorene, and carbazole; are included, and it is preferable to be an aromatic residue having a (C5 to C16) aromatic ring (an aromatic ring, and a condensed ring containing an aromatic ring), preferably having a (C5 to C13) aromatic ring (an aromatic ring, and a condensed ring containing an aromatic ring). The preferable aromatic residue includes a phenyl group substituted with mono- or di-hydroxyl groups or mono- or di-carboxyl groups and a 5- to 6-membered condensed ring optionally containing 1 to 2 hetero atoms composing of an oxygen atom, a sulfur atom and a nitrogen atom (said condensed ring may optionally be substituted with a carboxyl group, or a (C1 to C3) alkyl group which may optionally be substituted with a carboxyl group, in addition, said condensed ring may be a condensed ring containing 1 benzene ring).

In the above description, an aliphatic hydrocarbon residue in "an optionally substituted aliphatic hydrocarbon residue" includes a saturated and unsaturated straight chain, branched chain and cyclic alkyl group, including those having carbon atoms of preferably 1 to 36, and further preferably carbon atoms of 1 to 20. The cyclic alkyl group includes, for example, a (C3 to C8) cycloalkyl group or the like. Specific examples include a methyl group, an ethyl group, a n-propyl group, an iso-propyl group, a n-butyl group, an iso-butyl group, a tert-butyl group, an octyl group, an octadecyl group, an isopropyl group, a cyclohexyl group, a propenyl group, a pentynyl group, a butenyl group, a hexenyl group, a hexadienyl group, an isopropenyl group, an isohexenyl group, a cyclohexenyl group, a cyclopentadienyl group, an ethynyl group, a propynyl group, a pentynyl group, a hexynyl group, an isohexynyl group, a cyclohexynyl group and the like.

The alkoxycarbonyl group includes, for example, a (C1 to C10) alkoxycarbonyl group and the like.

The acyl group includes, for example, a (C1 to C10) alkylcarbonyl group and an arylcarbonyl group. The arylcarbonyl group includes a (C6 to C10) arylcarbonyl group such as a benzcarbonyl group and a naphthocarbonyl group. A preferable acyl group is a (C1 to C4) alkylcarbonyl group which may optionally be substituted with a halogeno group, including specifically an acetyl group, a trifluoromethylcarbonyl group, a pentafluoroethylcarbonyl group, a propionyl group or the like.

A substituent in "an optionally substituted aromatic residue" and "an optionally substituted aliphatic hydrocarbon residue" include, but not especially limited to, a sulfonic acid group; a sulfamoyl group; a cyano group; an isocyano group, a thiocyanato group; an isothiocyanato group; a nitro group; a nitorosyl group; a halogen atom; a hydroxyl group; a phosphoric acid group; a phosphoric ester group; substituted or unsubstituted amino group, a mercapto group which may optionally be substituted; an amide group which may optionally be substituted; an alkoxy group which may optionally be substituted; an optionally substituted aryloxy group; an aldehyde group; a substituted carbonyl group (for example, a carboxyl group, a carbamoyl group, an acyl group, alkoxycarbonyl group and the like); an optionally substituted aromatic residue; an optionally substituted aliphatic hydrocarbon residue. A halogen atom includes a fluorine atom, a chlorine atom, a bromine atom, an iodine atom and the like. A phosphoric ester group includes a (C1-C4) alkyl phosphoric ester group. A substituted or unsubstituted amino group includes an amino group; a mono- or a di(C1-C4) alkylamino group such as a mono- or a dimethylamino group, a mono- or a diethylamino group, a mono- or a dipropylamino group; a mono- or a diaromatic substituted amino group such as a mono- or a diphenylamino group, a mono- or a dinaphthylamino group; an amino group substituted with one alkyl group and one aromatic hydrocarbon residue, such as a monoalkyl mono phenyl amino group; a benzylamino group; an acyl amino group (for example, a mono- or a di(C2-C10) acylamino group such as an acetylamino group, a phenylacetylamino group or the like). A mercapto group which may optionally be substituted includes a (C1-C6) alkylmercapto group or a (C6-C10) aromatic mercapto group such as a mercapto group, an alkylmercapto group, a phenylmercapto group or the like. An amide group which may optionally be substituted includes an amide group, an alkylamide group, an arylamide group or the like. An alkoxy group includes a group wherein an oxygen atom bound to the above-described aliphatic hydrocarbon residue, for example, a (C1-C4) alkoxy group such as a methoxy group, an ethoxy group, a butoxy group or a tert-butoxy group; and the above-described optionally substituted aryloxy group includes a (C6-C10) aryloxy group such as a phenoxy group or a naphthoxy group, and these groups may have a phenyl group, a methyl group as a substituent. As the acyl group and the alkoxycarbonyl group, the same ones as described above are included. As optionally substituted aromatic residue and optionally substituted aliphatic hydrocarbon residue, each same ones as described above are included.

In addition, X1 may form a ring together with A1 or A2. In particular, it is preferable that X1 and A2 closest to X1 (A2 binding to the same carbon atom as the carbon atom which X1 is bound to) form a ring. In this case, the ring formed as =C(A2)(X1) is preferably an optionally substituted heterocycle residue. As said heterocycle ring, a 5- to 6-membered condensed ring which may optionally contain 1 to 2 hetero atoms composing of an oxygen atom, a sulfur atom and a nitrogen atom is preferable. Said condensed ring may optionally be substituted with an oxygen atom; a sulfur atom; a cyano group; a phenyl group; a carboxyl group; and a (C1 to C3) alkyl group which may optionally be substituted with a carboxyl group. In addition, said condensed ring may be a condensed ring containing 1 to 2, preferably 1 benzene ring. Specifically, the residue of pyridine, quinoline, pyran, chromene, pyrimidine, pyrrole, thiazole, benzothiazole, oxazole, benzoxazole, selenazole, benzoselenazole, imidazole, benzimidazole, pyrazole, thiophene, furan or the like is included. Each of the heterocycle residues may have additional rings or may be hydrogenated, and they may have a substituent as described above. In addition, a structure that forms a rhodanine ring, an oxazolidone ring, a thioxazolidone ring, a hydantoin ring, a thiohydantoin ring, an indandione ring, a thianaphthene ring, a pyrazolone ring, a barbituric ring, a thiobarbituric ring, a pyridone ring or the like, in combination of these substituents is preferable; a rhodanine ring and a pyrazolone ring are more preferable. In the case of a rhodanine ring, it is preferable that a carboxymethyl group is present at a nitrogen atom as a substituent, as the above-described B17, and in the case of a pyrazolone ring, those having a phenyl group at the 1-position, and a carboxyl group at the 3-position, as substituents, are preferable.

L1 in the Formula (1) represents an optionally substituted aromatic residue. As the aromatic residue, the same one as described above is included. As the linking group represented by -(L1)p1-, a divalent (C5 to C14) (total carbon atoms forming a ring) aromatic hydrocarbon residue composed of a single or a plurality of 5- to 6-membered aromatic rings is preferable. As the aromatic hydrocarbon residue, a divalent residue made by eliminating 2 hydrogen atoms from aromatic hydrocarbons such as benzene, naphthalene, anthracene, pyran, pyrrole, triazine, thiophene, thienothiophene, furan, oxazole, oxadiazole, thiazine, thiazole, benzothiazole, benzothiadiazole, benzoxazole, fluorene, carbazole or the like is included. As more preferable ones, aromatic residues selected from the group consisting of the groups represented by the following Formula are included. The most preferable one is a phenylene group, and as a linking group represented by -(L1) p1-, a biphenylene group is included.

(KA 6)

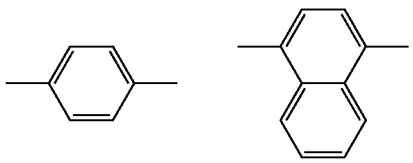

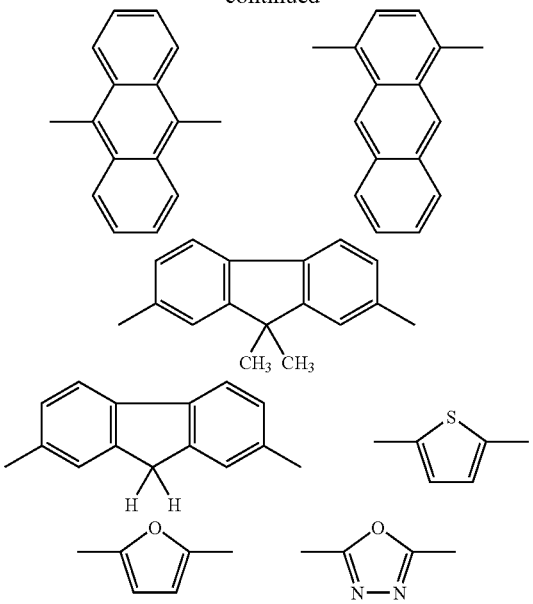

A1 and A2 in the Formula (1) each independently represent an optionally substituted aromatic residue; a hydroxyl group; a phosphoric acid group; a cyano group; a hydrogen atom; a halogen atom; an optionally substituted aliphatic hydrocarbon residue; a carboxyl group; a carbonamide group; an alkoxycarbonyl group; an acyl group such as an arylcarbonyl group or the like. Here, the aromatic residue, the halogen atom, the aliphatic hydrocarbon residue, the alkoxycarbonyl group and the acyl group each include the same ones as described on X1. Preferable A1 and A2 independently include a hydrogen atom; a halogen atom; a (C1 to C18) aliphatic hydrocarbon residue; a phenyl group; a hydroxy group; a mercapto group; an amino group which may optionally be substituted with a phenyl group; a carboxyl group; a cyano group; a (C2 to C4) acyl group which may optionally be substituted with 1 to 3 halogeno groups; or a nitro group. More preferably, a hydrogen atom; a halogen atom; a carboxyl group; a cyano group; a (C2 to C4) acyl group which may optionally be substituted with 1 to 3 halogeno groups; a nitro group; or the like; is included, and most preferably a hydrogen atom or a cyano group is included. A preferable combination of A1 and A2 is the case where A1 is a hydrogen atom and A2 is a cyano group or forms a 5 members condensed ring together with X1. As the condensed ring, the above-described ring B17 or ring B21 is preferable.

In the case where n1 is 1, such ones are preferable that A1 and A2 both are cyano groups, and that A1 is a hydrogen atom and A2 is a hydrogen atom, a cyano group or a carboxyl group.

In addition, in the case where n1 is 2 or larger, and A1 and A2 are present in plural, each of A1s and each of A2s may mutually and independently be the same or different. Preferably, A1 and A2 independently include a hydrogen atom, a cyano group, an aliphatic hydrocarbon residue, a halogen atom and a carboxyl group. As the aliphatic hydrocarbon residue and the halogen atom, each same ones as described above are included. As a preferable combination, in the case where n1 is 1, such ones are included that A1 and A2 both are cyano groups; and that A1 is a hydrogen atom and A2 is a hydrogen atom, a cyano group, acyl group or a carboxyl group; and more preferably, the case that A2 is a hydrogen atom or a cyano group.

In addition, in the case where n1 is 2 or larger, such one is preferable that A1 and A2 are all cyano groups, and that A1s are all hydrogen atoms and A2 closest to X1 (A2 binding to the same carbon atom to which X1 is bound) is a cyano group or a carboxyl group and other A2 is a hydrogen atom; more preferably the case that A2 is a hydrogen atom or a cyano group.

In combination with X1, such a case is preferable that A1 is a hydrogen atom (in the case where a plurality of A1s are present, all thereof are hydrogen atoms), X1 is a carboxyl group and A2 closest to X1 is a cyano group, a carboxyl group or an acyl group (in the case where other A2s are present, they are all hydrogen atoms); and further preferable is the case where X1 is a carboxyl group and A2 closest to X1 is a cyano group. As the acyl group, the same one as described above is included, and preferable one includes a (C2 to C4) acyl group which may optionally be substituted with a fluorine atom, and more preferable one includes a (C2 to C3) acyl group which may optionally be substituted with a fluorine atom; in more specifically, an acetyl group, a trifluoroacetyl group, a propionyl group, a hexafluoropropionyl group or the like is included. In the case where A1 is a hydrogen atom and A2 forms a ring by binding with X1, as the group represented by =C(A2)(X1), a cyclic methine group having the substituent represented by the above-described B17 or B21 is more preferable. In this case, n may be any number, however, 1 or 2 is preferable and 1 is more preferable. In addition, m may be any of 1 to 4, however, m is usually 1 or 2, and more preferably 1.

As the aromatic residues, the same one as described above may be included, and benzene, naphthalene, anthracene, thiophene, pyrrole, furan and the like are preferable. These aromatic residues may optionally have a substituent as described above, and said substituent is not especially limited, however, the same ones as described in the paragraph of said optionally substituted aromatic residue are included, and it is preferable that they are a substituted or unsubstituted amino group and optionally substituted aromatic residue.

In addition, A1, A2 and X1 may form a ring by any 2 thereof, and in the case where A1 and A2 are present in plural, a ring may be formed by arbitrary 2 thereof, or by any one of them together with X1; the resultant ring may optionally have a substituent.

In addition, in the case where n is 2 or larger, an optionally substituted ring may be formed by a plurality of, usually 2 among A1 or each of A1s when A1 is present in plural, A2 or each of A2s when A2 is present in plural, and X1.

In particular, it is preferable that A1 or each of A1s when A1 is present in plural, and A2 or each of A2s when A2 is present in plural form an optionally substituted ring by an arbitrary combination of A1 and A2; the resultant ring includes an unsaturated hydrocarbon ring or a heterocycle. As the unsaturated hydrocarbon ring, a benzene ring, a naphthalene ring, an anthracene ring, a phenanthrene ring, a pyrene ring, an indene ring, an azulene ring, a fluorene ring, a cyclobutene ring, a cyclohexene ring, a cyclopentene ring, a cyclohexadiene ring, a cyclopentadiene ring and the like are included, and a heterocycle includes a pyridine ring, a pyrazine ring, a piperidine ring, an indoline ring, a furan ring, a pyran ring, an oxazole ring, a thiazole ring, an indole ring, a benzothiazole ring, a benzoxazole ring, a quinoline ring, a carbazole ring, a benzopyrane ring and the like. Among them, preferable ones include a benzene ring, a cyclobutene ring, a cyclopentene ring, a cyclohexene ring, a pyran ring, a furan ring and the like. They may optionally have the substituent, as described above, and as the substituent, the same one as described in the substituent item in said optionally substituted aromatic residue and optionally substituted aliphatic hydrocarbon residue may be included. In addition, in the case where a carbonyl group, a thiocarbonyl group, or the like is present, a cyclic ketone or a cyclic thioketone or the like may be formed; these rings also may have a substituent. As the substituent, the same ones as described in the description of the substituent of said optionally substituted aromatic residue and optionally substituted aliphatic hydrocarbon residue may be included.

It is preferable that A1 and A2 are present in plural, and in the case where any two thereof can form a ring by condensation, a ring may be formed. In this case, it is preferable that adjacent A1 and A2, or the adjacent A1 and A1 with one space or adjacent A2 and A2 with one space form a 5- to 6-membered condensed ring. Said condensed ring is preferably a pyrrole ring, a thienyl ring, a furan ring or the like.

Furthermore, in the case where the above-described X1 is a heterocycle residue having a nitrogen atom, and/or in the case where a heterocycle formed by X1 and A1 or/and A2 has a nitrogen atom, the nitrogen atom may be quaternized and have a counter ion at quaternization. The counter ion is not especially limited and may be a general anion. Specifically, $F^-$, $Cl^-$, $Br^-$, $I^-$, $ClO_4^-$, $BF_4^-$, $PF_6^-$, $OH^-$, $SO_4^{2-}$, $CH_3SO_4^-$, toluene sulfonate ion or the like is included; $Br^-$, $I^-$, $ClO_4^-$, $BF_4^-$, $PF_6^-$, $CH_3SO_4^-$, toluene sulfonate ion or the like is preferable. In addition, the nitrogen atom may be neutralized by an acid group such as an intramolecular or intermolecular carboxyl group instead of a counter ion.

In addition, in the case where X1 and/or a heterocycle formed by X1 and A1 or/and A2, has an acid group such as a hydroxyl group, a phosphoric acid group, a sulfonic acid group and carboxyl group, each thereof may form a salt, and as the salt, for example, a salt with alkaline metals or alkaline earth metals such as lithium, sodium, potassium, magnesium, calcium; or organic bases, for example, quaternary ammonium salts such as tetramethyl ammonium, tetrabutyl ammonium, pyridinium, imidazolium, piperazinium, piperidinium or the like is included.

The ring a1 in the Formula (1) may have one or a plurality of substituents. Said substituents may be a halogen atom, an amide group, a hydroxyl group, a cyano group, a nitro group, an alkoxyl group, an acyl group, a substituted or unsubstituted amino group, an optionally substituted aliphatic hydrocarbon residue or an optionally substituted aromatic residue. As the halogen atom, the amide group, the alkoxyl group, the acyl group, the substituted or unsubstituted amino group, the aliphatic hydrocarbon residue or the aromatic residue, the same ones as described on X1 may be included each. In addition, the ring a1 may form a ring which may have a substituent, each by mutually binding in the case where the ring a1 has a plurality of substituents, or by binding together with an adjacent other ring a1 or L1. An example of the ring formed, for example, includes a carbazole ring, a thienoindole ring, a phenoxazine ring, a phenothiazine ring or the like, a carbazole ring is preferable. These rings formed may optionally have a substituent as described above. As the substituents, the same one as described in the item of said optionally substituted aromatic residue may be included. As a preferable substituent on the ring a1, a (C1 to C4) alkyl group, a phenyl group, a (C6 to C10) aryloxy group (for example, a phenyloxy group, a biphenyloxy group, a naphthyloxy group or the like; these groups may optionally be substituted with a (C1 to C3) alkyl group) or the like is included. In this connection, substituents on each ring a1 may be the same or different, and further there may be the ring a1 not having a substituent. In addition, at least any one of the 4 a1 rings is one substituted with a vinyl group enclosed by ( )m.

As a preferable example of the case where a ring is formed by binding of the adjacent a1 rings, the case where a carbazole ring is formed by binding of 2 a1 rings binding to the same nitrogen atom, together with said nitrogen atom is included. In this case, a compound, in which 2 carbazole rings are linked by -(L1)p1-, is preferable. In this case, such -(L1)p1- is preferable that L1 is a phenyl group and p1 is 1 or 2, and a biphenylene group (L1 is a phenyl group and p1 is 2) is more preferable.

The compound represented by the Formula (1) may be a structural isomer such as cis, trans, racemic form or the like, however, not especially limited, and any form of isomers can effectively be used as a photo-sensitizing dye.

In addition, as one of preferable examples of the methine dye represented by the Formula (1), a compound represented by the following Formula (2) may be included:

(KA 7)

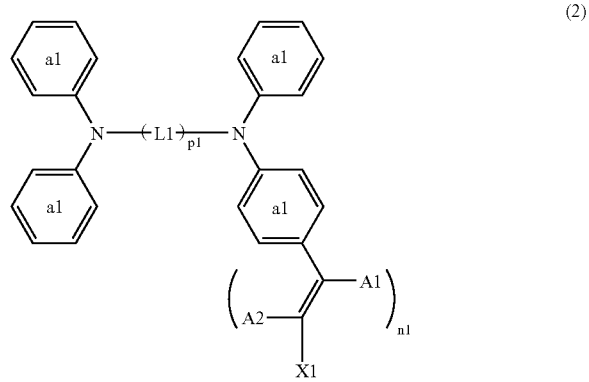

(2)

(In the Formula (2), n1, p1, L1, X1, A1, A2 and ring a1 each represent the same meaning as in the Formula (1).)

In addition, as other one of preferable examples of the methine dye represented by the Formula (1), a compound represented by the following Formula (3) may be included.

In this connection, each of the following cases are preferable: a substituent onto a benzene ring a1 in the Formulae (2) and (3) is a phenyl group, a (C1 to C3) alkyl group (for example a methyl group), or a di(C1 to C3) alkylamino group (for example a dimethylamino group); n1 is 1 to 5; p1 is 1 to 4, preferably 1 or 2; L1 is a phenyl group; or X1, A1 and A2 are those exemplified as preferable ones above.

(KA 8)

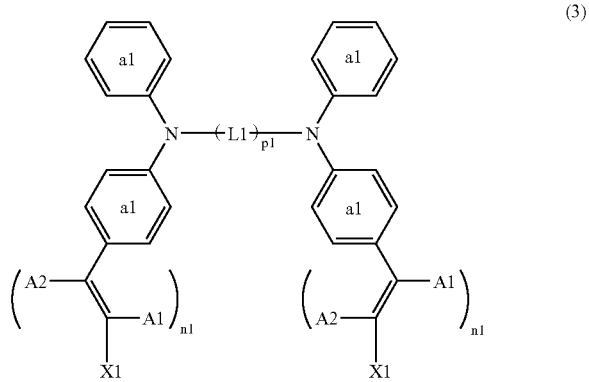

(3)

(In the Formula (3), n1, p1, L1, X1, A1, A2 and ring a1 each represent the same meaning as in the Formula (1).)

Among the methine dyes represented by the Formula (2), the methine dyes represented by the Formula (7) to be described later, and also, among the methine dyes represented by the Formula (3), the methine dyes represented by the Formula (8) to be described later are included each as further preferable examples.

The methine dyes represented by the Formula (1), can be produced by, for example, the following reaction equation.

First of all, after metallization of the compound of the Formula (4) using a base such as butyllithium, the compound (5), which is a precursor of the compound (1), is obtained by a method for subjecting an amide derivative such as dimethylformamide to react; or by a method for subjecting to a reaction with the Vilsmeier reagent prepared by treatment of phosphoryl chloride or the like to dimethylformamide; or the like. In this case, the compound (5) having a propenal group is obtained. In the case where n is 2 or larger, the compound (5) in the case where n is 2 or larger is obtained by a method for subjecting a formyl group or the like to the Claisen condensation reaction; by a method for using amide derivatives such as dimethylaminoacrolein and dimethylaminovinylacrolein; by a method for converting a formyl group or the like to a vinyl group or the like by the Wittig reaction, the Grignard reaction or the like, followed by subjecting to the above-described formylation reaction or the like. In this case, the compound (5) having a pentadienal group is obtained. Then, the methine dye represented by the Formula (1) can be obtained by condensation of the compound (5) and the compound (6) having a activated methylene group at 20° C. to 180° C., preferably at 50° C. to 150° C., in a solvent such as alcohols such as methanol, ethanol, isopropanol, and butanol; or aprotic polar solvents such as dimethylformamide and N-methylpyrrolidone; toluene; acetic anhydride; or the like, in the presence of a basic catalyst such as caustic soda, sodium methylate, sodium acetate, diethylamine, triethylamine, piperidine, piperazine, and diazabicycloundecene, if necessary. In addition, in the case where X1 is a carboxyl group or a phosphoric acid group, the methine dye represented by the Formula (1) can also be obtained by a reaction of an activated methylene compound having an alkoxycarbonyl group or a phosphoric ester group, respectively with the compound (5), and subsequent hydrolysis. In addition, number of m may be controlled by the addition amount of butyllithium or the Vilsmeier reagent in the above formylation.

(KA 9)

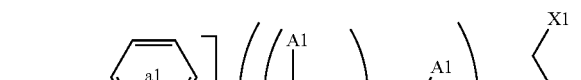

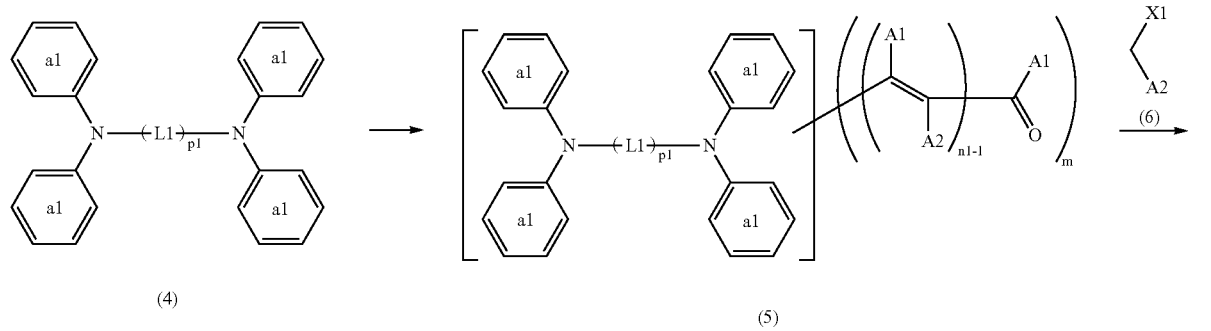

(4)

(5)

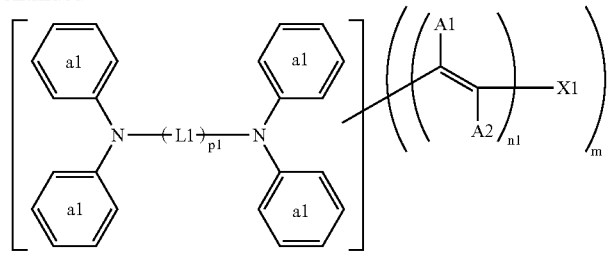

(1)

Specific examples of the methine dyes which may be used in the present invention are shown below.

As examples of the methine dyes represented by the Formula (2), which are preferable in the present invention, specific examples of the dyes represented by the following Formula (7) are shown in Table 1 and Table 2. A phenyl group is abbreviated as Ph. In addition, rings of X4 (rings B1 to B13) and rings formed by X4 and A8 (rings B14 to B29) are shown separately.

(KA 10)

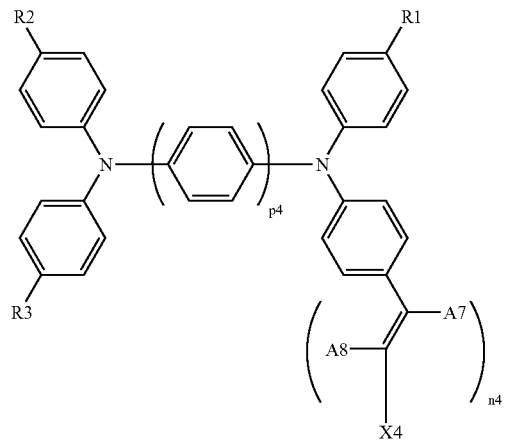

(7)

wherein R1, R2 and R3 each independently represent a hydrogen atom, a phenyl group, a (C1 to C3) alkyl group (for example a methyl group), or a di(C1 to C3) alkylamino group (for example a dimethylamino group), p4 represents 1 to 4, n4 represents 1 to 5, A7 represents a hydrogen atom, a (C1 to C18) alkyl group or a phenyl group, A8 represents a hydrogen, a cyano group, a (C2 to C3) acyl group which may optionally be substituted with a halogen atom preferably a fluorine atom, a carboxyl group, a nitro group or a condensed ring with X4, X4 represents a carboxyl group; a phosphoric acid group; a phenyl group substituted with a hydroxyl or/and a carboxyl group (preferably, a dihydroxy substituted phenyl group, or a phenyl group substituted with both a hydroxy group and a carboxyl group), a 5- to 6-membered condensed heterocycle, which may optionally have a benzene ring or a naphthalene ring and contains 1 or 2 hetero atoms selected from the group consisting of a nitrogen atom, a sulfur atom and an oxygen atom (those having a (C1 to C8) alkyl group (for example, a methyl group, an ethyl group or an octyl group), a carboxyl group or a carboxy (C1 to C3) alkyl group (for example, a carboxymethyl group or a carboxyethyl group), on the ring as a substituent, are preferable) (specifically the group represented by the Formula B1 to B13 to be described later); or a condensed ring with A8, and the condensed ring of X4 and A8 represents a 5- to 6-membered condensed heterocycle which may optionally have a benzene ring or a naphthalene ring, and contains 1 or 2 hetero atoms selected from the group consisting of a nitrogen atom, a sulfur atom and an oxygen atom (said condensed ring may optionally be substituted with an oxygen atom; a sulfur atom; a cyano group; a phenyl group; a carboxyl group; or a (C1 to C3) alkyl group which may optionally be substituted with a carboxyl group).

TABLE 1

| Compound | n4 | p4 | R1 | R2 | R3 | A7 | A8 | X4 |
|---|---|---|---|---|---|---|---|---|
| 1 | 1 | 1 | H | H | H | H | H | COOH |
| 2 | 1 | 1 | H | H | H | H | CN | COOH |
| 3 | 1 | 1 | H | H | H | $CH_3$ | CN | COOH |
| 4 | 1 | 1 | H | H | H | $C_2H_5$ | CN | COOH |
| 5 | 1 | 1 | H | H | H | $C_4H_9$ | CN | COOH |
| 6 | 1 | 1 | H | H | H | $C_8H_{17}$ | CN | COOH |
| 7 | 1 | 1 | H | H | H | $C_{18}H_{37}$ | CN | COOH |
| 8 | 1 | 1 | H | H | H | $CH(CH_3)_2$ | CN | COOH |
| 9 | 1 | 1 | H | H | H | $C(CH_3)_3$ | CN | COOH |
| 10 | 1 | 1 | H | H | H | H | $COCH_3$ | COOH |
| 11 | 1 | 1 | H | H | H | H | $COCF_3$ | COOH |
| 12 | 1 | 1 | H | H | H | H | $COCF_2CF_3$ | COOH |
| 13 | 1 | 1 | H | H | H | H | CN | COOLi |
| 14 | 1 | 1 | H | H | H | H | CN | COONa |
| 15 | 1 | 1 | H | H | H | H | COOH | COOH |
| 16 | 1 | 1 | H | H | H | H | $NO_2$ | COOH |
| 17 | 1 | 1 | H | H | H | Ph | CN | COOH |
| 18 | 1 | 1 | $CH_3$ | $CH_3$ | $CH_3$ | H | CN | COOH |

TABLE 1-continued

| Compound | n4 | p4 | R1 | R2 | R3 | A7 | A8 | X4 |
|---|---|---|---|---|---|---|---|---|
| 19 | 1 | 1 | Ph | Ph | Ph | H | CN | COOH |
| 20 | 1 | 1 | H | H | H | H | CN | PO(OH)$_2$ |
| 21 | 1 | 2 | H | H | H | H | CN | COOH |
| 22 | 1 | 3 | H | H | H | H | CN | COOH |
| 23 | 1 | 4 | H | H | H | H | CN | COOH |
| 24 | 2 | 1 | H | H | H | H | H | COOH |
| 25 | 3 | 1 | H | H | H | H | H | COOH |
| 26 | 4 | 1 | H | H | H | H | H | COOH |
| 27 | 5 | 1 | H | H | H | H | H | COOH |
| 28 | 2 | 2 | H | H | H | H | H | COOH |
| 29 | 1 | 1 | H | H | H | H | H | Ring B1 |
| 30 | 1 | 1 | H | H | H | H | H | Ring B2 |
| 31 | 1 | 1 | H | H | H | H | H | Ring B3 |
| 32 | 1 | 1 | H | H | H | H | H | Ring B4 |
| 33 | 1 | 1 | H | H | H | H | H | Ring B5 |
| 34 | 1 | 1 | H | H | H | H | H | Ring B6 |
| 35 | 1 | 1 | H | H | H | H | H | Ring B7 |
| 36 | 1 | 1 | H | H | H | H | H | Ring B8 |
| 37 | 1 | 1 | H | H | H | H | H | Ring B9 |
| 38 | 1 | 1 | H | H | H | H | H | Ring B10 |
| 39 | 1 | 1 | H | H | H | H | H | Ring B11 |
| 40 | 1 | 1 | H | H | H | H | H | Ring B12 |
| 41 | 1 | 1 | H | H | H | H | H | Ring B13 |

TABLE 2

| Compound | n4 | p4 | R1 | R2 | R3 | A7 | A8 | X4 |
|---|---|---|---|---|---|---|---|---|
| 42 | 1 | 1 | H | H | H | H | Formation of ring B14 by A8 and X4 | |
| 43 | 1 | 1 | H | H | H | H | Formation of ring B15 by A8 and X4 | |
| 44 | 1 | 1 | H | H | H | H | Formation of ring B16 by A8 and X4 | |
| 45 | 1 | 1 | H | H | H | H | Formation of ring B17 by A8 and X4 | |
| 46 | 1 | 1 | H | H | H | H | Formation of ring B18 by A8 and X4 | |
| 47 | 1 | 1 | H | H | H | H | Formation of ring B19 by A8 and X4 | |
| 48 | 1 | 1 | H | H | H | H | Formation of ring B20 by A8 and X4 | |
| 49 | 1 | 1 | H | H | H | H | Formation of ring B21 by A8 and X4 | |
| 50 | 1 | 1 | H | H | H | H | Formation of ring B22 by A8 and X4 | |
| 51 | 1 | 1 | H | H | H | H | Formation of ring B23 by A8 and X4 | |
| 52 | 1 | 1 | H | H | H | H | Formation of ring B24 by A8 and X4 | |
| 53 | 1 | 1 | H | H | H | H | Formation of ring B25 by A8 and X4 | |
| 54 | 1 | 1 | H | H | H | H | Formation of ring B26 by A8 and X4 | |
| 55 | 1 | 1 | H | H | H | H | Formation of ring B27 by A8 and X4 | |
| 56 | 1 | 1 | H | H | H | H | Formation of ring B28 by A8 and X4 | |
| 57 | 1 | 1 | H | H | H | H | Formation of ring B29 by A8 and X4 | |
| 58 | 1 | 2 | H | H | H | H | Formation of ring B14 by A8 and X4 | |
| 59 | 1 | 2 | H | H | H | H | Formation of ring B15 by A8 and X4 | |
| 60 | 1 | 2 | H | H | H | H | Formation of ring B16 by A8 and X4 | |
| 61 | 1 | 2 | H | H | H | H | Formation of ring B17 by A8 and X4 | |
| 62 | 1 | 2 | H | H | H | H | Formation of ring B18 by A8 and X4 | |
| 63 | 1 | 2 | H | H | H | H | Formation of ring B19 by A8 and X4 | |
| 64 | 1 | 2 | H | H | H | H | Formation of ring B20 by A8 and X4 | |
| 65 | 1 | 2 | H | H | H | H | Formation of ring B21 by A8 and X4 | |
| 66 | 1 | 2 | H | H | H | H | Formation of ring B22 by A8 and X4 | |
| 67 | 1 | 2 | H | H | H | H | Formation of ring B23 by A8 and X4 | |
| 68 | 1 | 2 | H | H | H | H | Formation of ring B24 by A8 and X4 | |
| 69 | 1 | 2 | H | H | H | H | Formation of ring B25 by A8 and X4 | |
| 70 | 1 | 2 | H | H | H | H | Formation of ring B26 by A8 and X4 | |
| 71 | 1 | 2 | H | H | H | H | Formation of ring B27 by A8 and X4 | |
| 72 | 1 | 2 | H | H | H | H | Formation of ring B28 by A8 and X4 | |
| 73 | 1 | 2 | H | H | H | H | Formation of ring B29 by A8 and X4 | |

(KA 11)
B1

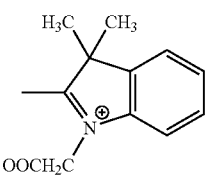

B2

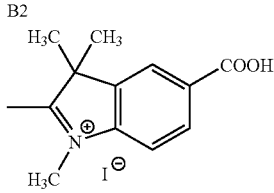

TABLE 2-continued

| Compound | n4 | p4 | R1 | R2 | R3 | A7 | A8 | X4 |
|---|---|---|---|---|---|---|---|---|
| B3 | | | | | | | | |
| B4 | | | | | | | | |
| B5 | | | | | | | | |
| B6 | | | | | | | | |
| B7 | | | | | | | | |
| B8 | | | | | | | | |
| B9 | | | | | | | | |
| B10 | | | | | | | | |
| B11 | | | | | | | | |
| B12 | | | | | | | | |
| B13 | | | | | | | | |
| B14 | | | | | | | | |
| B15 | | | | | | | | |
| B16 | | | | | | | | |
| B17 | | | | | | | | |
| B18 | | | | | | | | |

(Structures shown for each compound B3–B18.)

TABLE 2-continued
| Compound | n4 | p4 | R1 | R2 | R3 | A7 | A8 | X4 |
|---|---|---|---|---|---|---|---|---|
B19
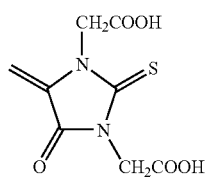
B20
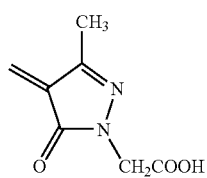
B21
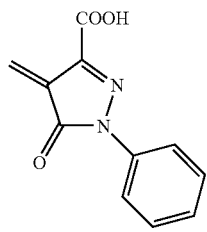
B22
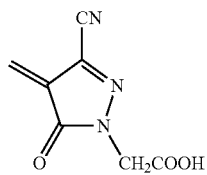
B23
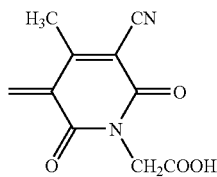
TABLE 2-continued
| Compound | n4 | p4 | R1 | R2 | R3 | A7 | A8 | X4 |
|---|---|---|---|---|---|---|---|---|
B24
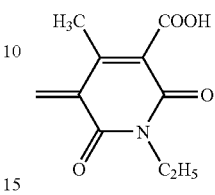
B25
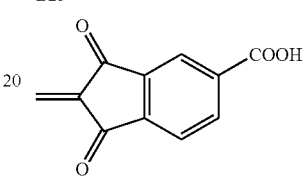
B26
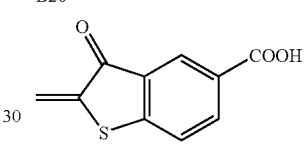
B27
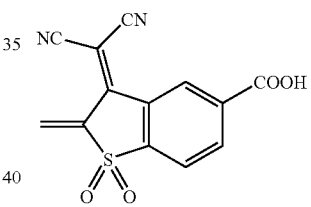
B28
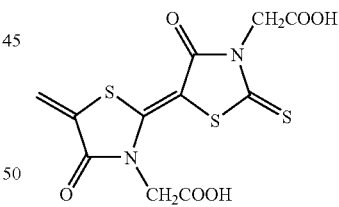
B29
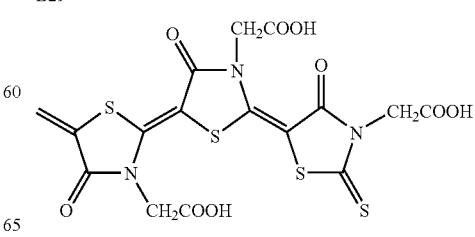

Other examples of the methine dyes represented by the Formula (7) are shown below.
(KA 12)
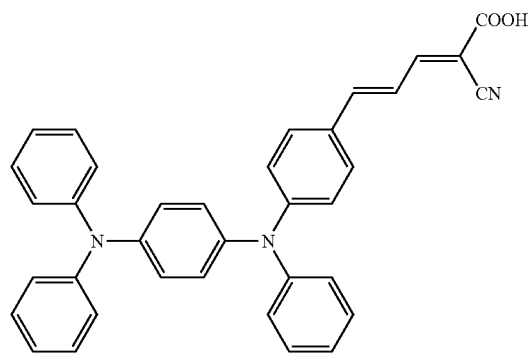
(74)
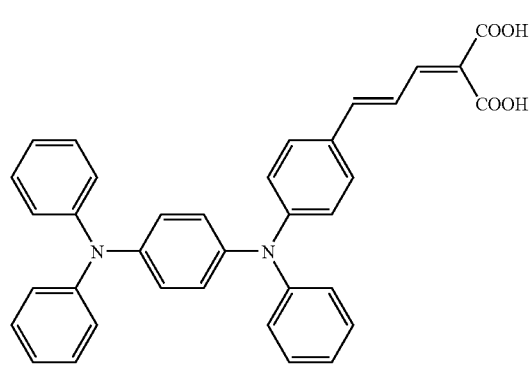
(75)
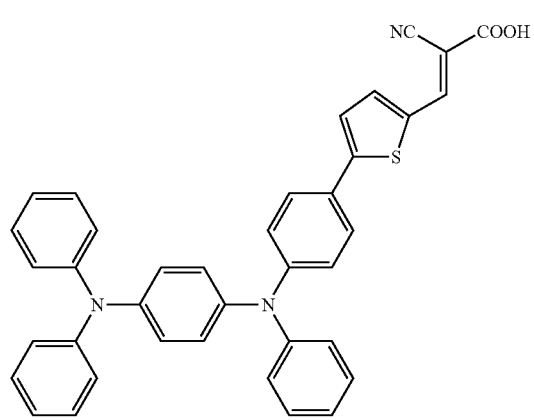
(76)
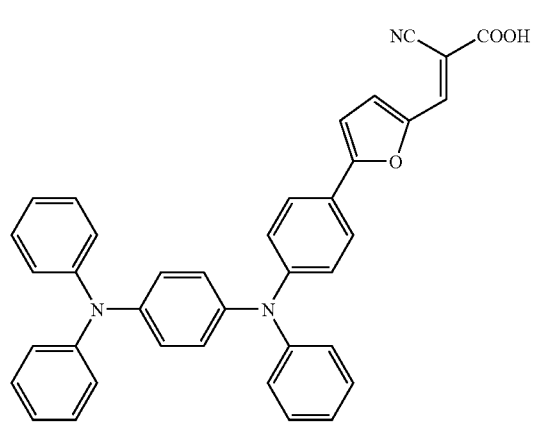
(77)

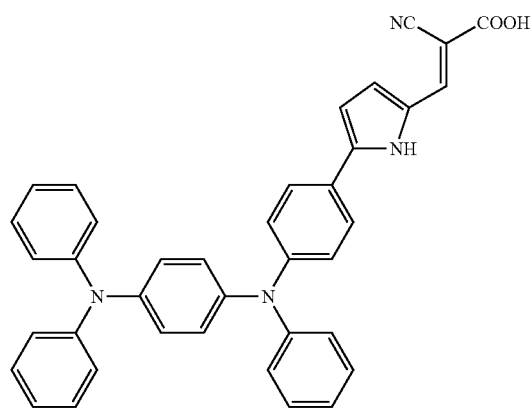
(78)
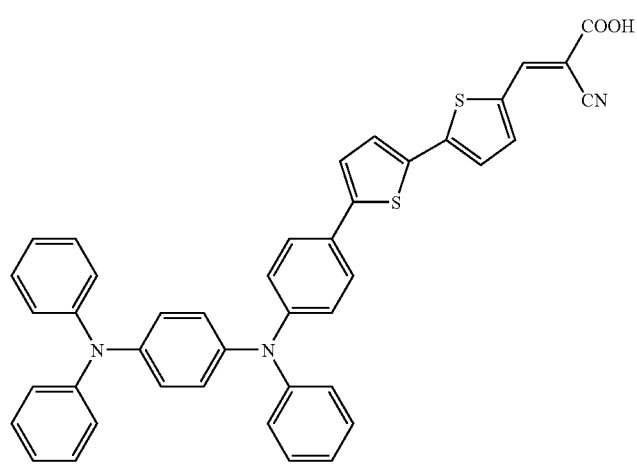
(80)
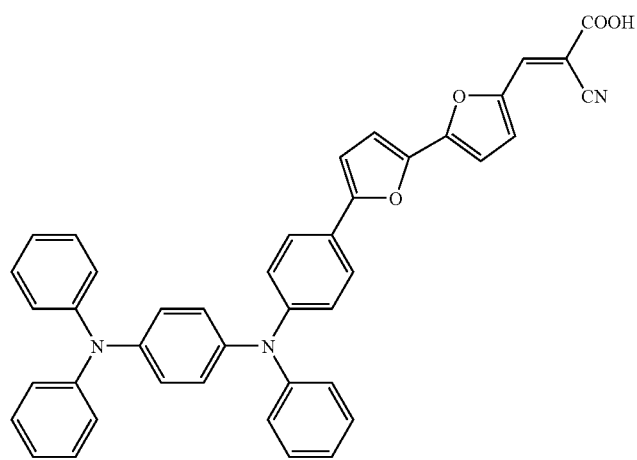
(81)

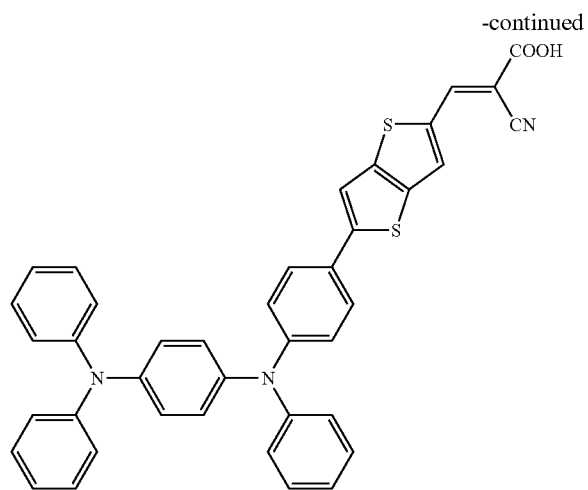
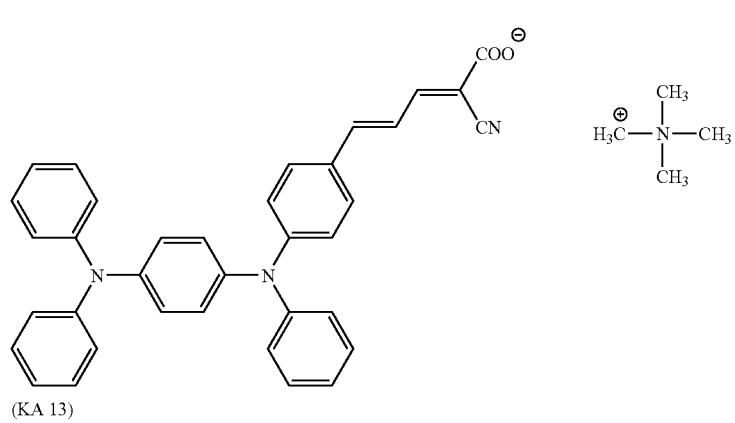
(KA 13)
(83)
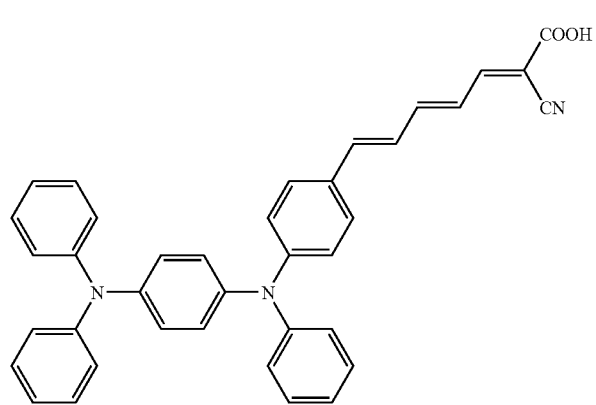
(84)
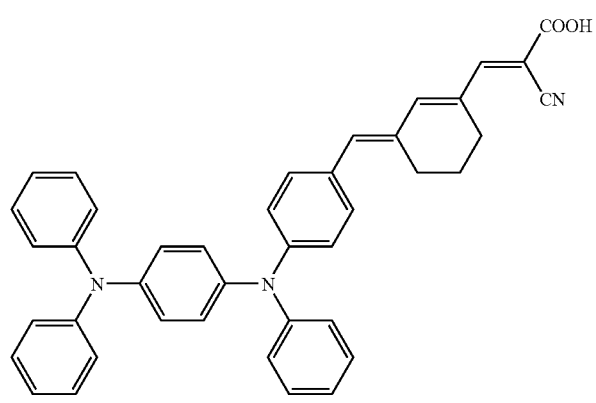
(85)

-continued
(86)
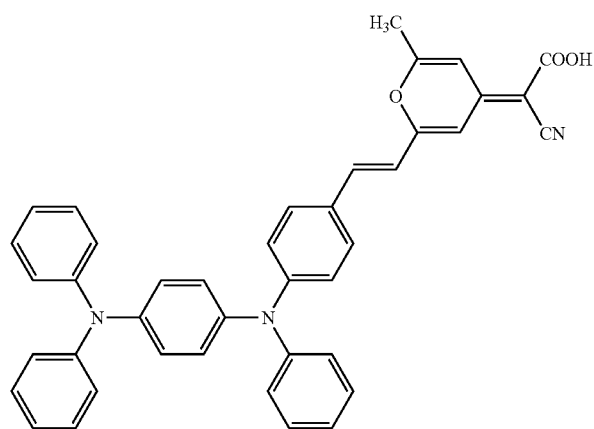
(87)
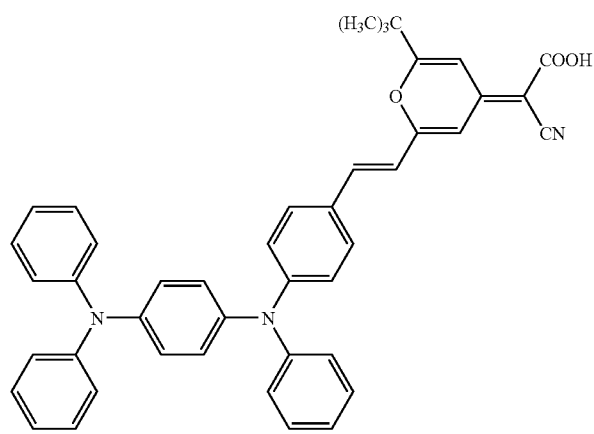
(88)
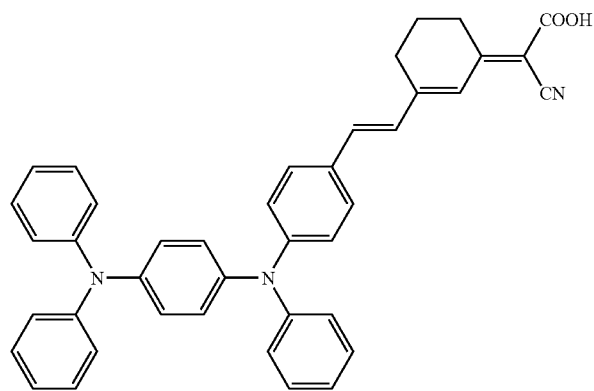
(89)
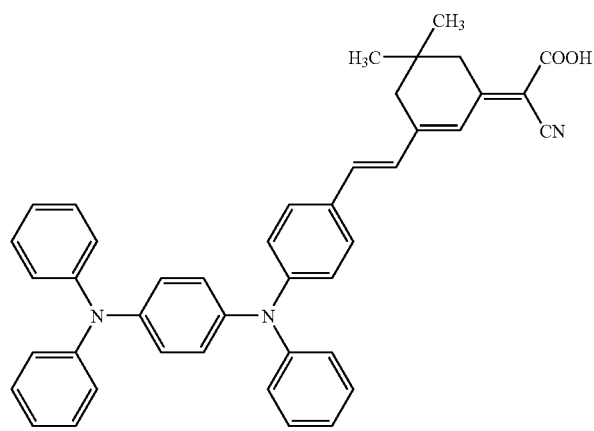

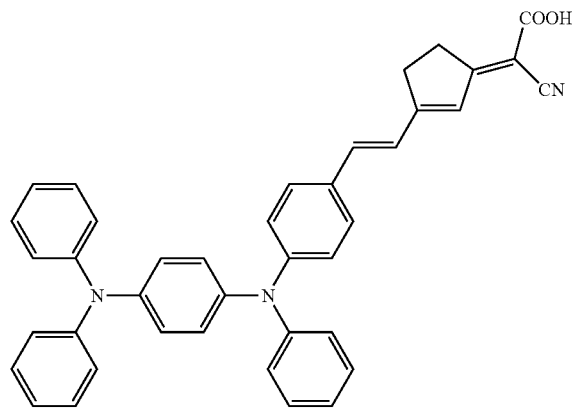
(90)
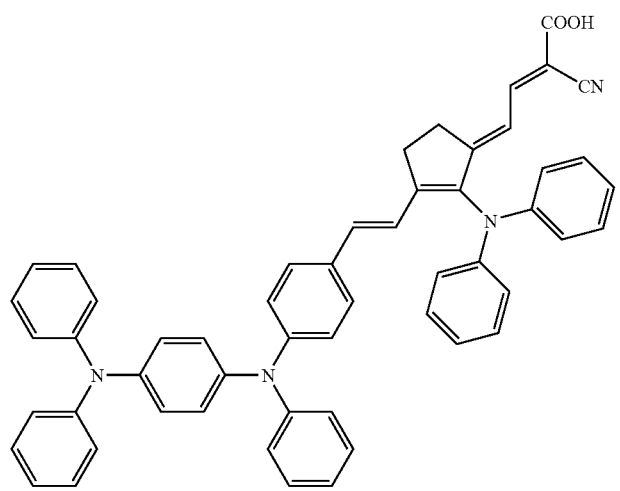
(91)
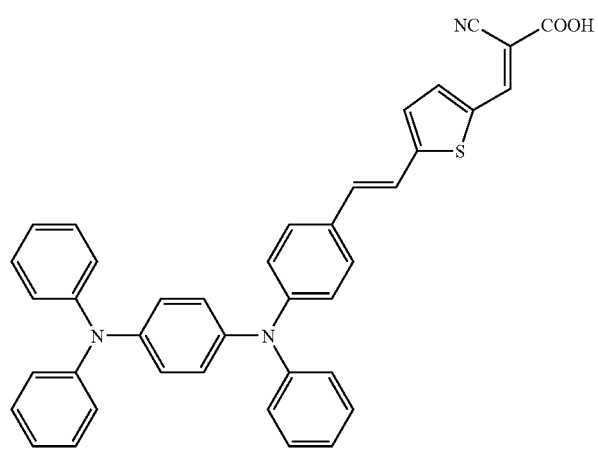
(92)

-continued
(93)
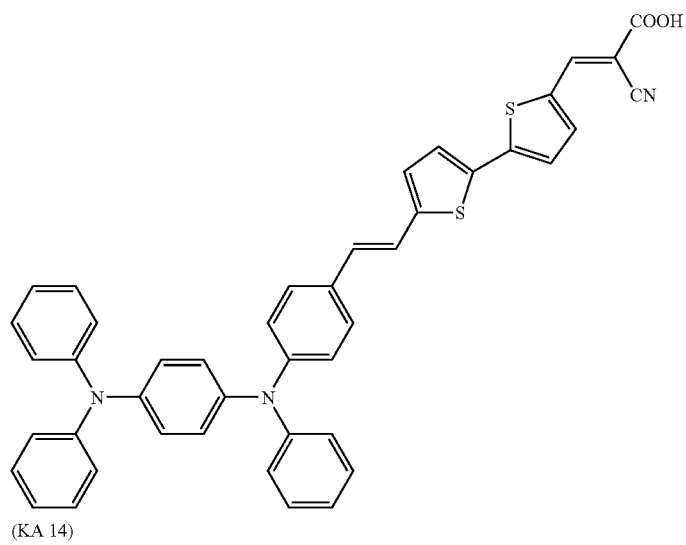
(KA 14)
(94)
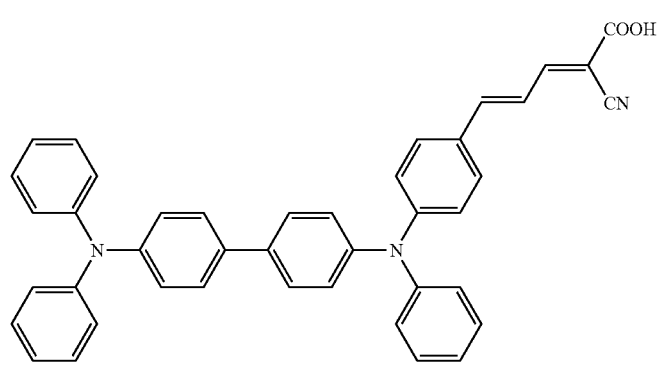
(95)
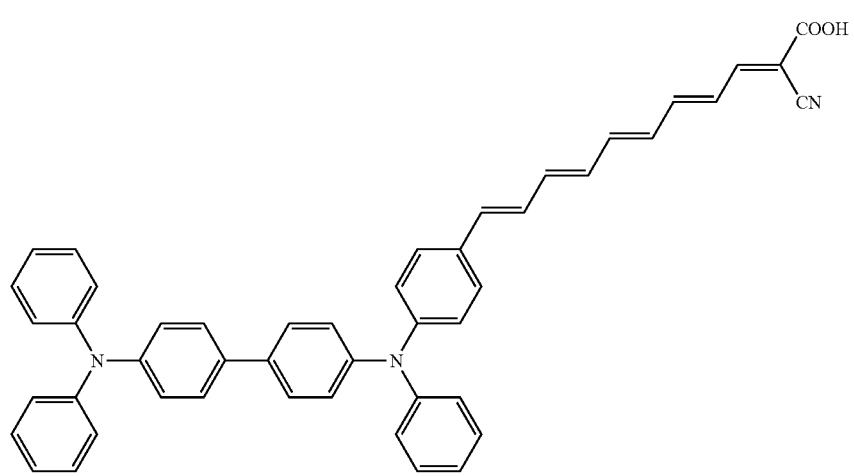

-continued
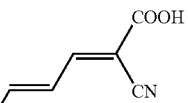
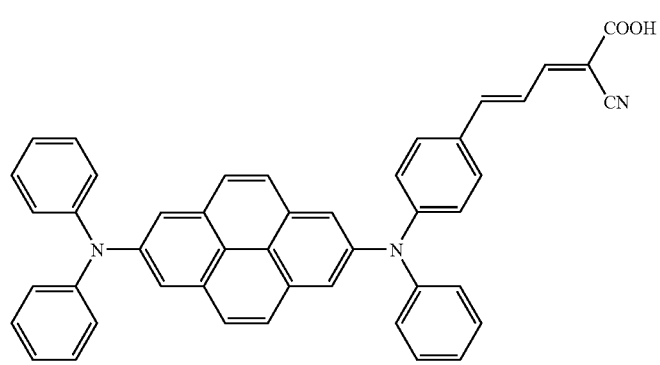
(96)
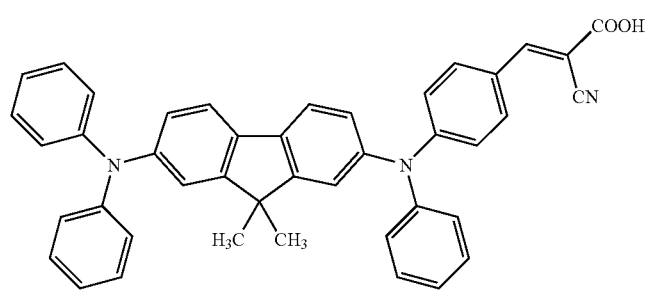
(97)
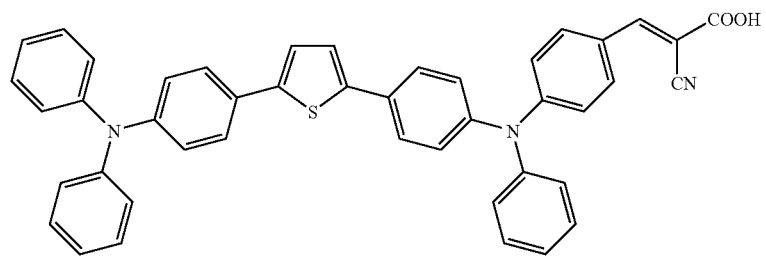
(98)
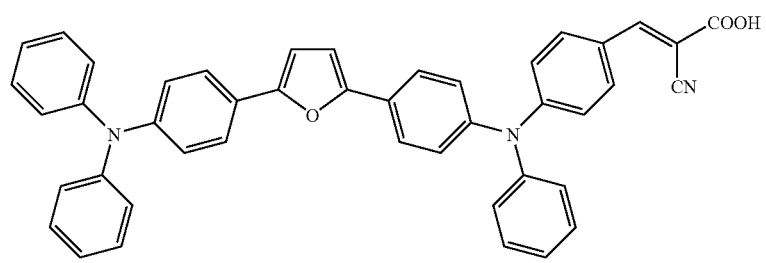
(99)
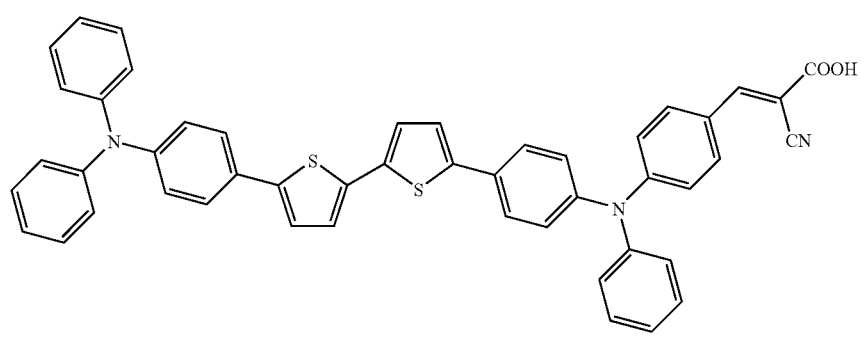
(100)

-continued
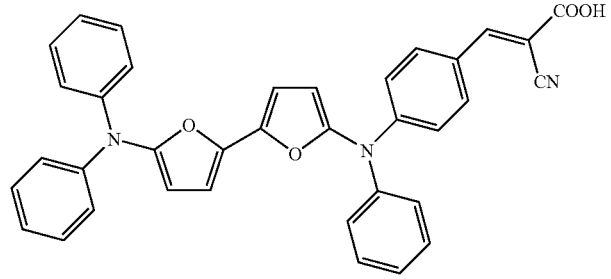
(101)
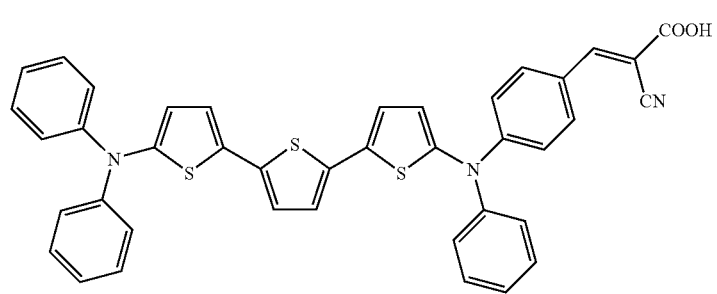
(102)
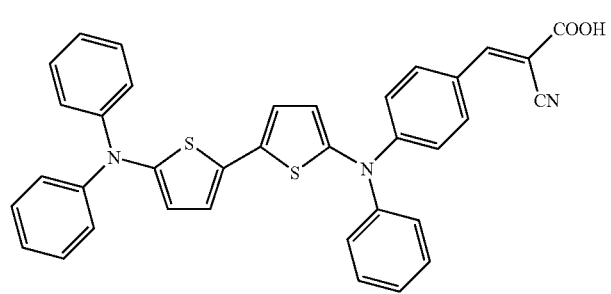
(103)
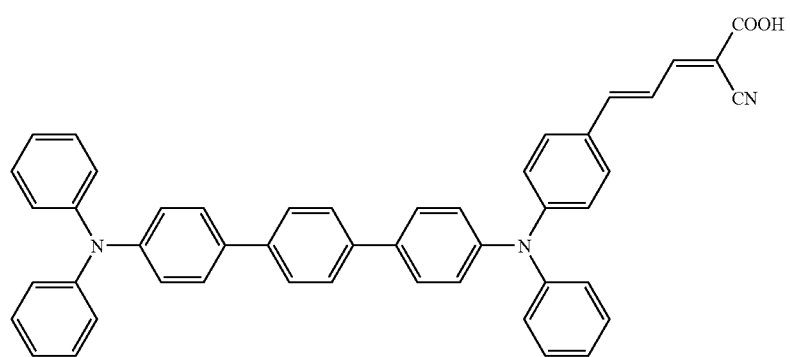
(104)

(KA 15)
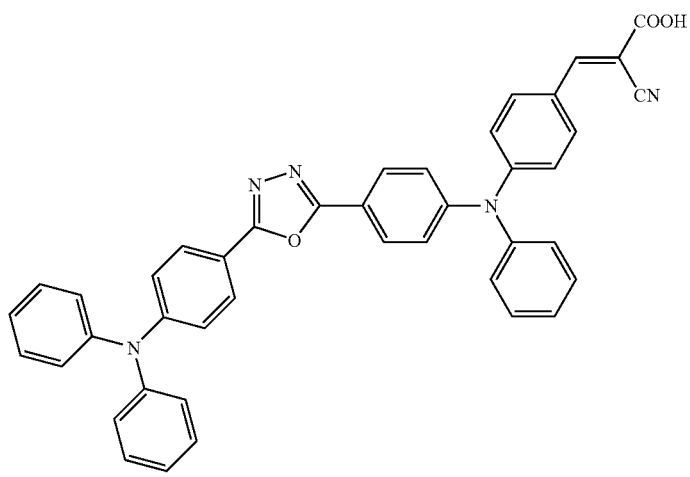
(105)
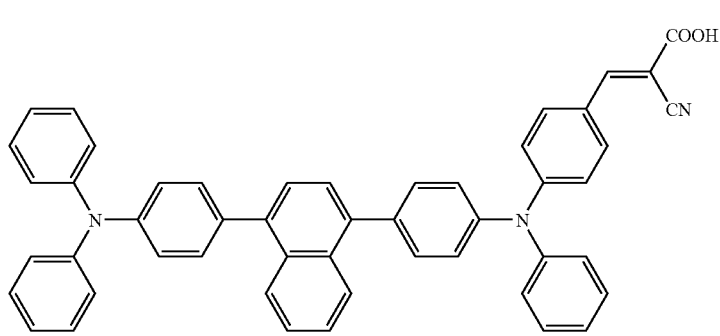
(106)
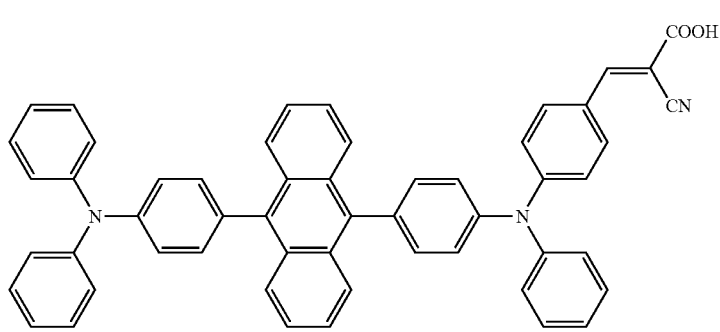
(107)
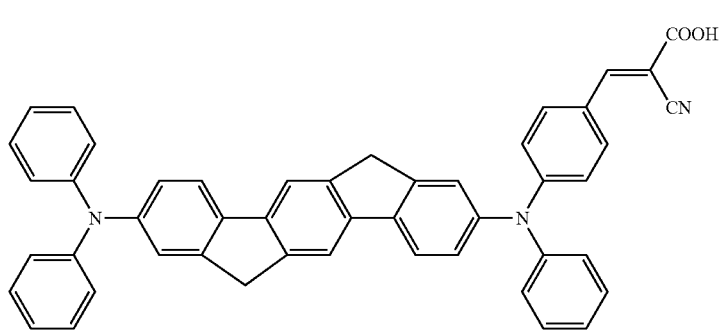
(108)

-continued
(109)
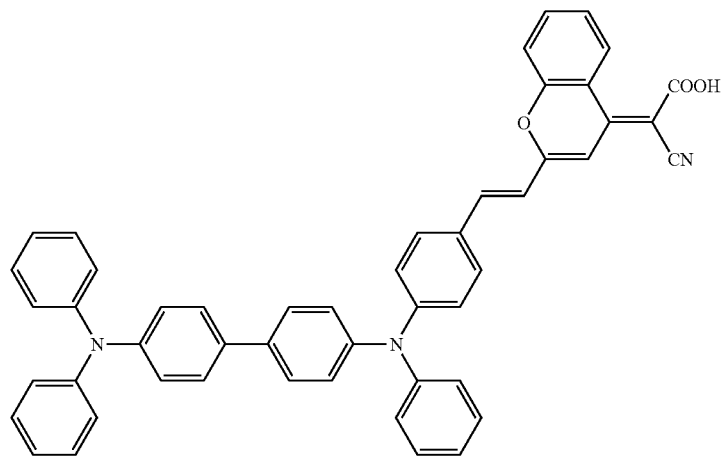
(110)
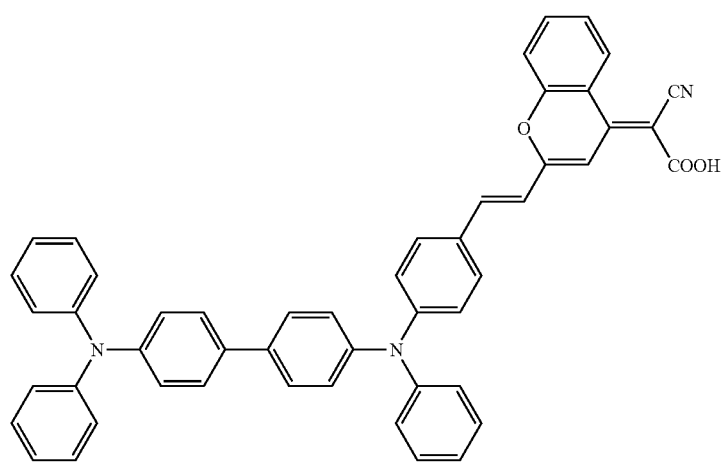
(111)
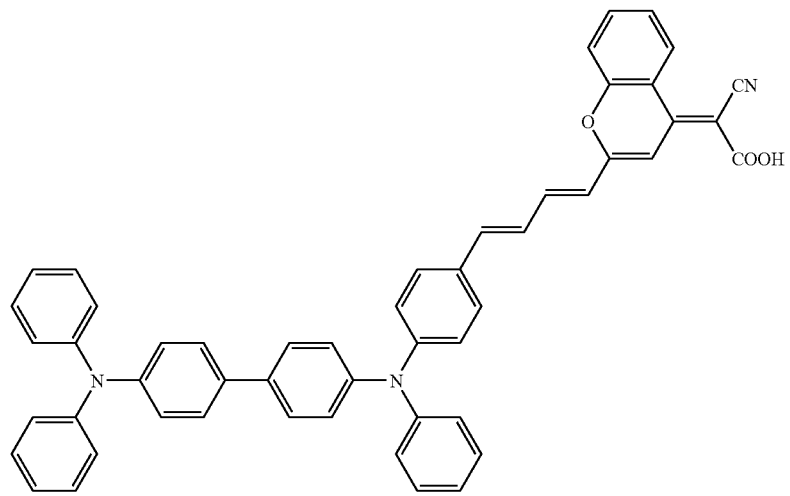

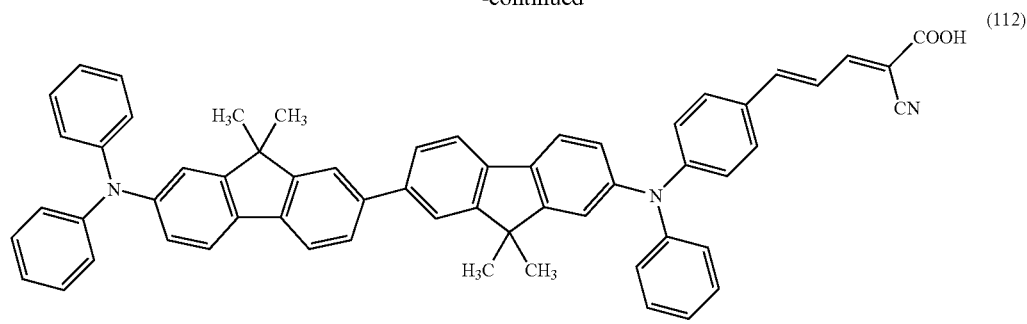
(112)

Next, as examples of the methine dyes represented by the Formula (3), which are preferable in the present invention, specific examples of the dyes represented by the following Formula (8) are shown in Table 3 and Table 4. A phenyl group is abbreviated as Ph. In addition, the rings of X5 (B1 to B13) and the rings formed by X5 and A10 (B14 to B29) are the same as described above.

(KA 16)

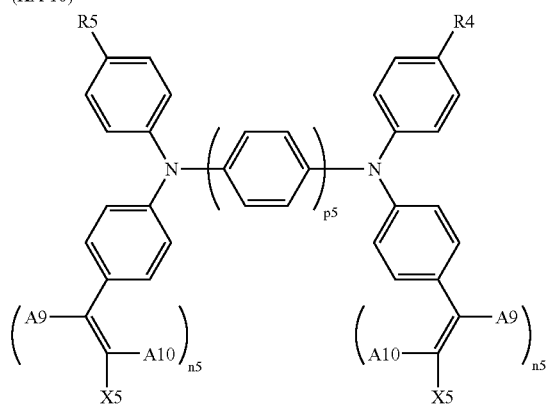

(8)

wherein R4 and R5 each independently represent a hydrogen atom, a phenyl group, a (C1 to C3) alkyl group (for example a methyl group), or a di(C1 to C3) alkylamino group (for example a dimethylamino group), p5 represents 1 to 4, n5 represents 1 to 5, A9 represents a hydrogen atom, a (C1 to C3) alkyl group (for example a methyl group) or a phenyl group, A10 represents a hydrogen atom, a cyano group, a (C2 to C3) acyl group which may optionally be substituted with a halogen atom preferably a fluorine atom, a carboxyl group, a nitro group, or a condensed ring with X5, X5 represents a carboxyl group; a phosphoric acid group; a phenyl group substituted with a hydroxy or/and a carboxyl group (preferably, a dihydroxy substituted phenyl group, or a phenyl group substituted with both a hydroxyl group and a carboxyl group), a 5- to 6-membered condensed heterocycle, which may optionally have a benzene ring or a naphthalene ring and contains 1 or 2 hetero atoms selected from the group consisting of a nitrogen atom, a sulfur atom and an oxygen atom (those having a (C1 to C8) alkyl group (for example, a methyl group, an ethyl group or an octyl group); a carboxyl group; or a carboxy (C1 to C3) alkyl group (for example, a carboxymethyl group or a carboxyethyl group), on the ring as a substituent, are preferable) (specifically a group represented by the Formulae B1 to B13 as described above); or a condensed ring with A8, a condensed ring of X4 and A8 represents a 5- to 6-membered condensed heterocycle, which may optionally have a benzene ring or a naphthalene ring and contains 1 or 2 hetero atoms selected from the group consisting of a nitrogen atom, a sulfur atom and an oxygen atom (said condensed ring may optionally be substituted with an oxygen atom; a sulfur atom; a cyano group; a phenyl group; a carboxyl group; or a (C1 to C3) alkyl group which may optionally be substituted with a carboxyl group).

TABLE 3

| Compound | n5 | p5 | R4 | R5 | A9 | A10 | X5 |
|---|---|---|---|---|---|---|---|
| 113 | 1 | 1 | H | H | H | H | COOH |
| 114 | 1 | 1 | H | H | H | CN | COOH |
| 115 | 1 | 1 | H | H | $CH_3$ | CN | COOH |
| 116 | 1 | 1 | H | H | H | $COCH_3$ | COOH |
| 117 | 1 | 1 | H | H | H | $COCF_3$ | COOH |
| 118 | 1 | 1 | H | H | H | Br | COOH |
| 119 | 1 | 1 | H | H | H | CN | COOLi |
| 120 | 1 | 1 | H | H | H | CN | COONa |
| 121 | 1 | 1 | H | H | H | COOH | COOH |
| 122 | 1 | 1 | H | H | H | $NO_2$ | COOH |
| 123 | 1 | 1 | H | H | Ph | CN | COOH |
| 124 | 1 | 1 | $CH_3$ | $CH_3$ | H | CN | COOH |
| 125 | 1 | 1 | Ph | Ph | H | CN | COOH |
| 126 | 1 | 1 | $N(CH_3)_2$ | $N(CH_3)_2$ | H | CN | COOH |
| 127 | 1 | 1 | H | H | H | CN | $PO(OH)_2$ |
| 128 | 1 | 2 | H | H | H | CN | COOH |
| 129 | 1 | 3 | H | H | H | CN | COOH |
| 130 | 1 | 4 | H | H | H | CN | COOH |
| 131 | 2 | 1 | H | H | H | H | COOH |
| 132 | 3 | 1 | H | H | H | H | COOH |
| 133 | 4 | 1 | H | H | H | H | COOH |
| 134 | 5 | 1 | H | H | H | H | COOH |
| 135 | 2 | 2 | H | H | H | H | COOH |
| 136 | 1 | 1 | H | H | H | H | Ring B1 |

TABLE 3-continued

| Compound | n5 | p5 | R4 | R5 | A9 | A10 | X5 |
|---|---|---|---|---|---|---|---|
| 137 | 1 | 1 | H | H | H | H | Ring B2 |
| 138 | 1 | 1 | H | H | H | H | Ring B3 |
| 139 | 1 | 1 | H | H | H | H | Ring B4 |
| 140 | 1 | 1 | H | H | H | H | Ring B5 |
| 141 | 1 | 1 | H | H | H | H | Ring B6 |
| 142 | 1 | 1 | H | H | H | H | Ring B7 |
| 143 | 1 | 1 | H | H | H | H | Ring B8 |
| 144 | 1 | 1 | H | H | H | H | Ring B9 |
| 145 | 1 | 1 | H | H | H | H | Ring B10 |
| 146 | 1 | 1 | H | H | H | H | Ring B11 |
| 147 | 1 | 1 | H | H | H | H | Ring B12 |
| 148 | 1 | 1 | H | H | H | H | Ring B13 |

TABLE 4

| Compound | n5 | p5 | R4 | R5 | A9 | A10 | X5 |
|---|---|---|---|---|---|---|---|
| 149 | 1 | 1 | H | H | H | Formation of ring B14 by A10 and X5 |
| 150 | 1 | 1 | H | H | H | Formation of ring B15 by A10 and X5 |
| 151 | 1 | 1 | H | H | H | Formation of ring B16 by A10 and X5 |
| 152 | 1 | 1 | H | H | H | Formation of ring B17 by A10 and X5 |
| 153 | 1 | 1 | H | H | H | Formation of ring B18 by A10 and X5 |
| 154 | 1 | 1 | H | H | H | Formation of ring B19 by A10 and X5 |
| 155 | 1 | 1 | H | H | H | Formation of ring B20 by A10 and X5 |
| 156 | 1 | 1 | H | H | H | Formation of ring B21 by A10 and X5 |
| 157 | 1 | 1 | H | H | H | Formation of ring B22 by A10 and X5 |
| 158 | 1 | 1 | H | H | H | Formation of ring B23 by A10 and X5 |
| 159 | 1 | 1 | H | H | H | Formation of ring B24 by A10 and X5 |
| 160 | 1 | 1 | H | H | H | Formation of ring B25 by A10 and X5 |
| 161 | 1 | 1 | H | H | H | Formation of ring B26 by A10 and X5 |
| 162 | 1 | 1 | H | H | H | Formation of ring B27 by A10 and X5 |
| 163 | 1 | 1 | H | H | H | Formation of ring B28 by A10 and X5 |
| 164 | 1 | 1 | H | H | H | Formation of ring B29 by A10 and X5 |
| 165 | 1 | 2 | H | H | H | Formation of ring B14 by A10 and X5 |
| 166 | 1 | 2 | H | H | H | Formation of ring B15 by A10 and X5 |
| 167 | 1 | 2 | H | H | H | Formation of ring B16 by A10 and X5 |
| 168 | 1 | 2 | H | H | H | Formation of ring B17 by A10 and X5 |
| 169 | 1 | 2 | H | H | H | Formation of ring B18 by A10 and X5 |
| 170 | 1 | 2 | H | H | H | Formation of ring B19 by A10 and X5 |
| 171 | 1 | 2 | H | H | H | Formation of ring B20 by A10 and X5 |
| 172 | 1 | 2 | H | H | H | Formation of ring B21 by A10 and X5 |
| 173 | 1 | 2 | H | H | H | Formation of ring B22 by A10 and X5 |
| 174 | 1 | 2 | H | H | H | Formation of ring B23 by A10 and X5 |
| 175 | 1 | 2 | H | H | H | Formation of ring B24 by A10 and X5 |
| 176 | 1 | 2 | H | H | H | Formation of ring B25 by A10 and X5 |
| 177 | 1 | 2 | H | H | H | Formation of ring B26 by A10 and X5 |
| 178 | 1 | 2 | H | H | H | Formation of ring B27 by A10 and X5 |
| 179 | 1 | 2 | H | H | H | Formation of ring B28 by A10 and X5 |
| 180 | 1 | 2 | H | H | H | Formation of ring B29 by A10 and X5 |

Other examples of the methine dyes represented by the Formula (8) are shown below.

(KA 17)

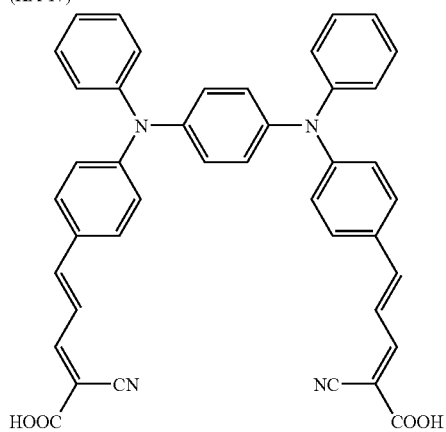

(181)

-continued
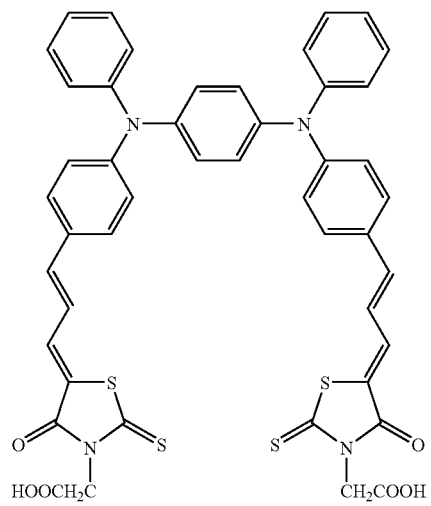
(182)
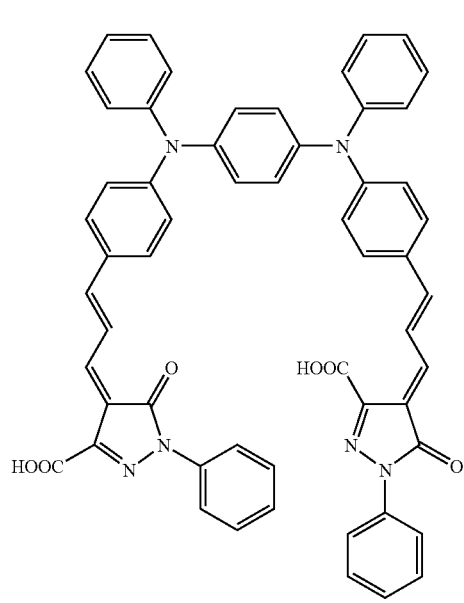
(183)
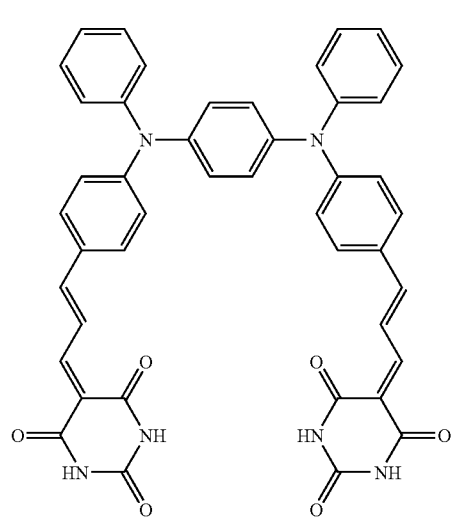
(184)

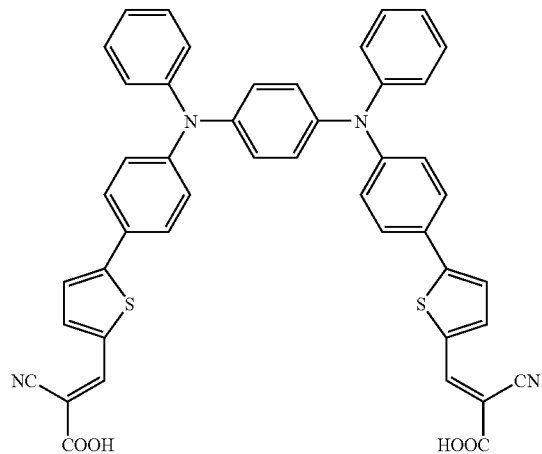
(185)
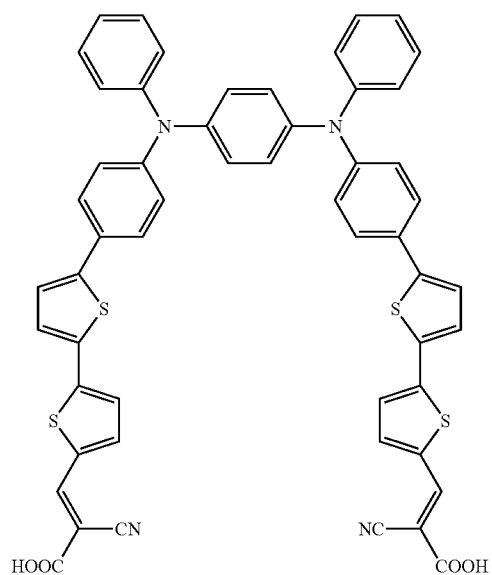
(186)
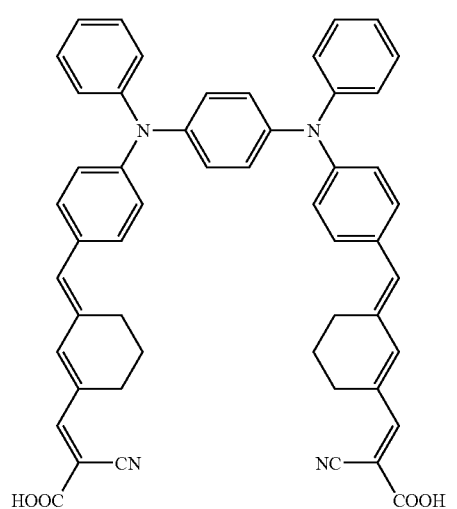
(187)

(188)
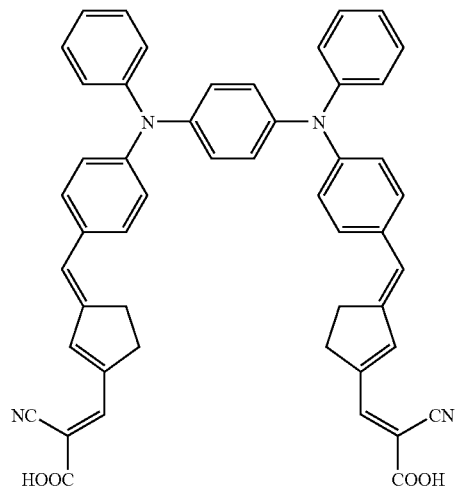
(KA 18)
(189)
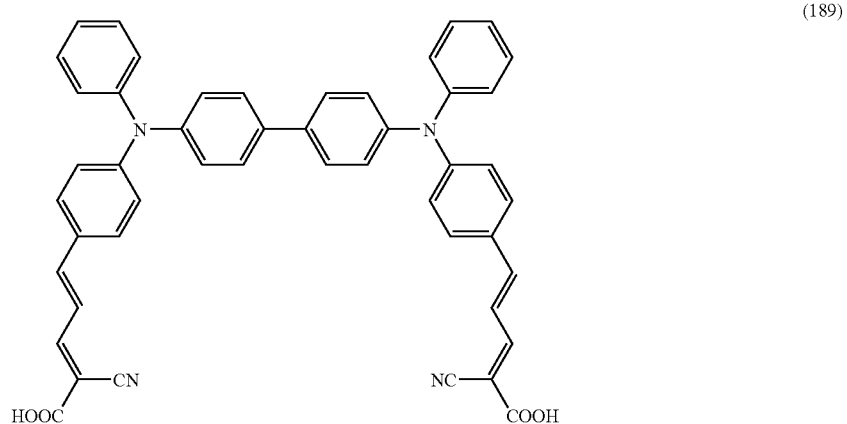
(190)
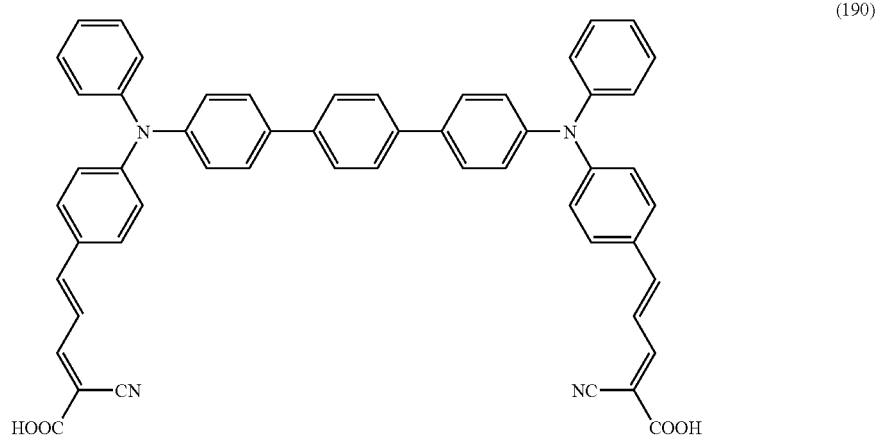

(191)
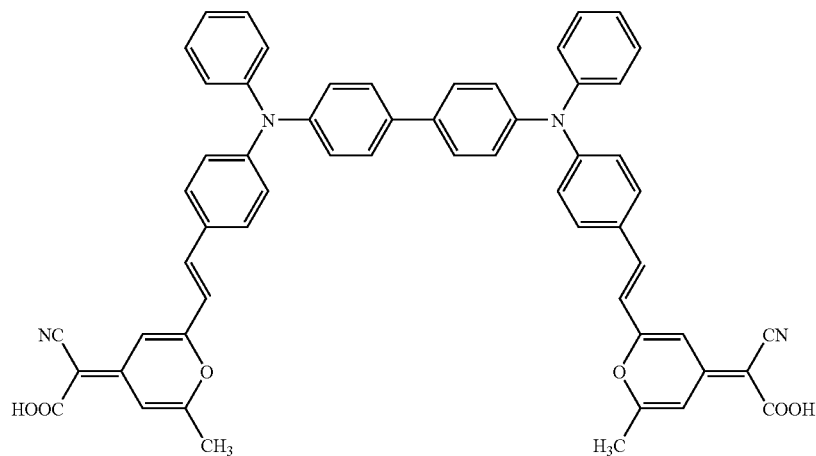
(192)
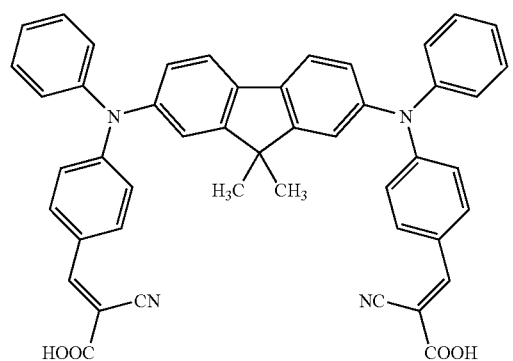
Furthermore, other examples included in the methine dyes represented by the Formula (1) are shown below.
(KA 19)
(193)
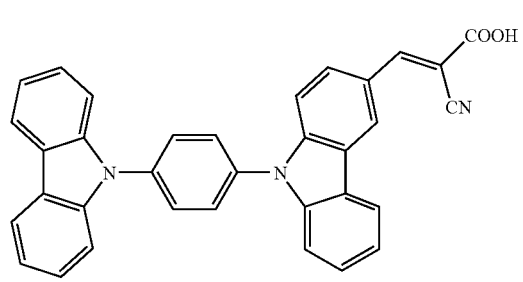
(194)
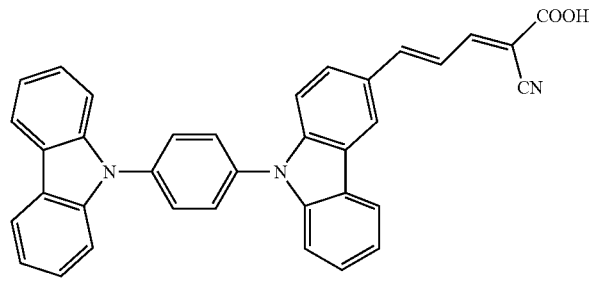

-continued
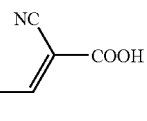
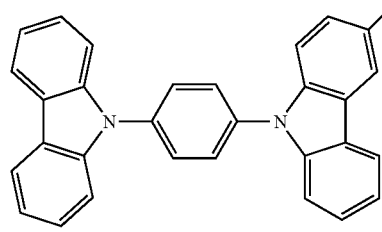
(195)
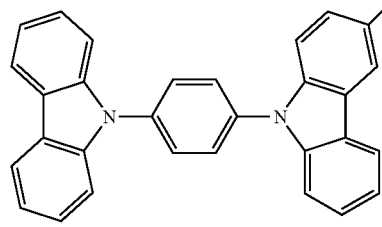
(196)
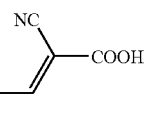
(197)
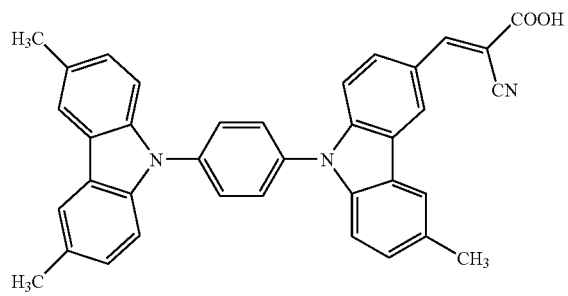
(198)
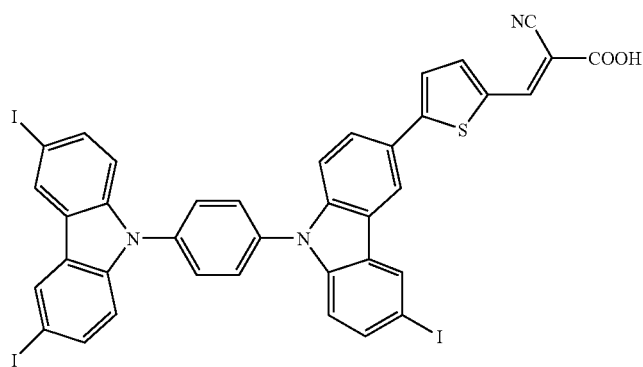
(199)

-continued
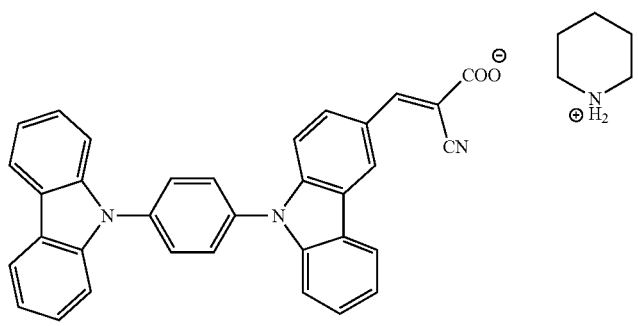
(200)
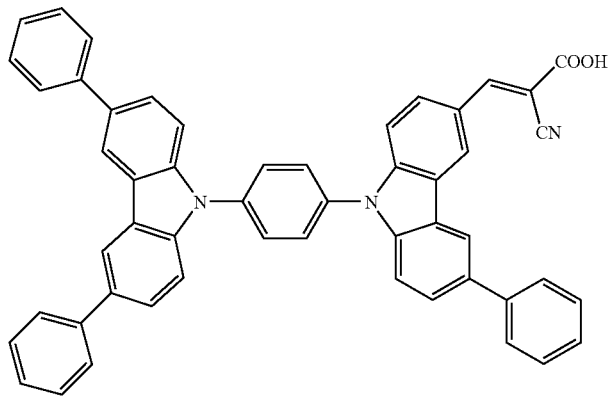
(201)
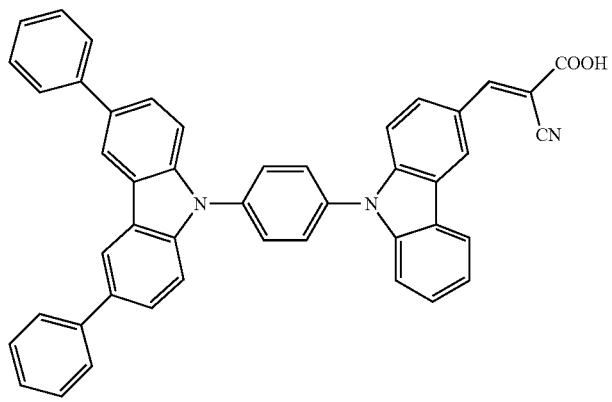
(202)
(KA 20)
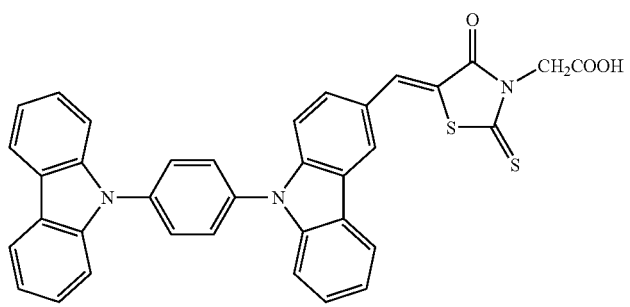
(203)

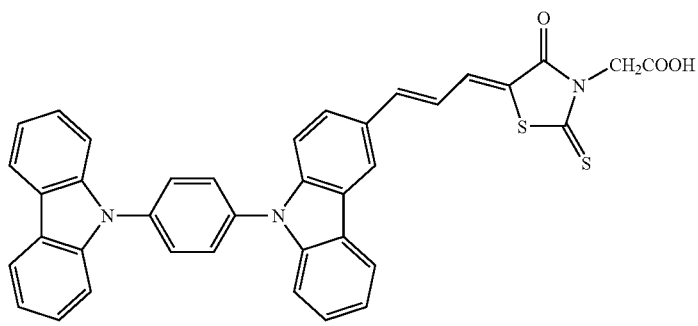
(204)
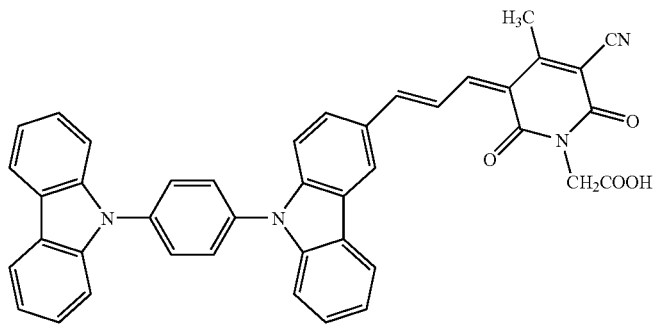
(205)
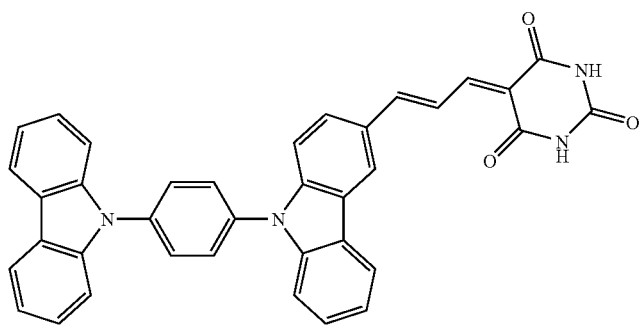
(206)
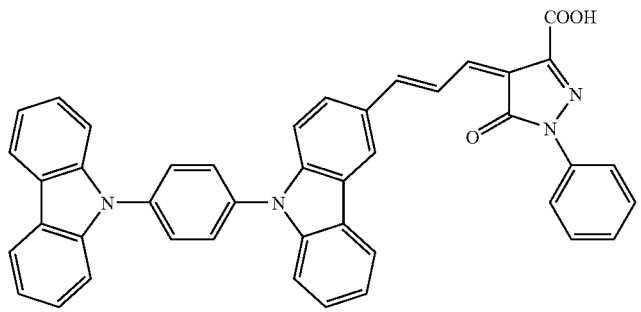
(207)
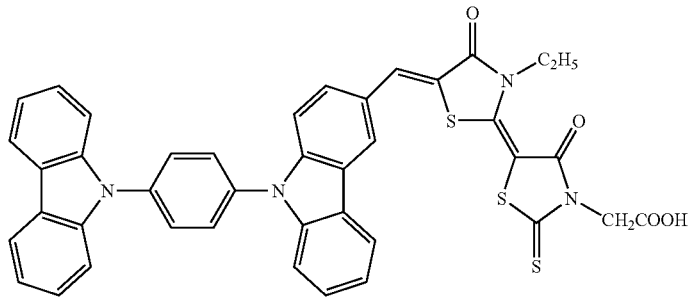
(208)

-continued
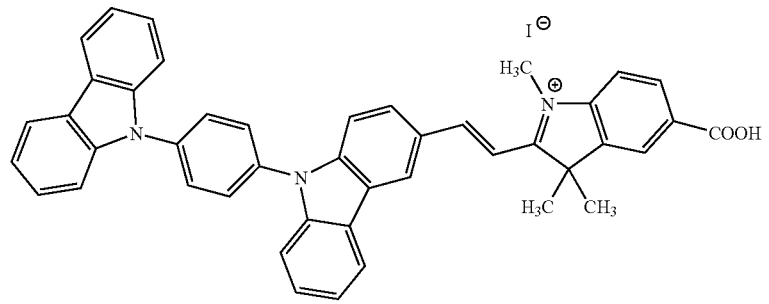
(209)
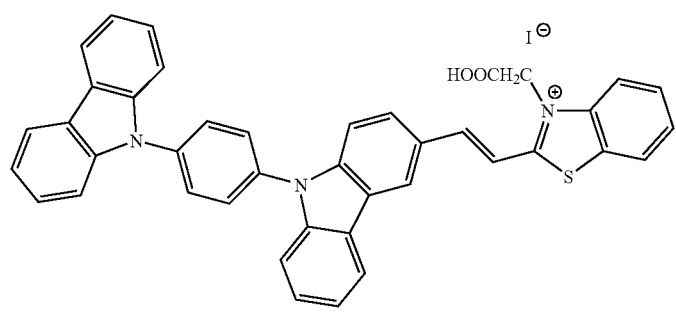
(210)
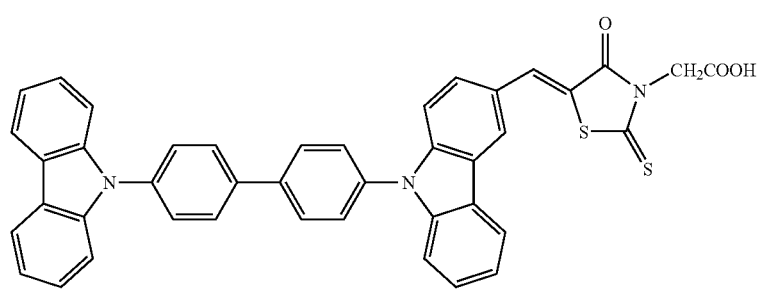
(211)
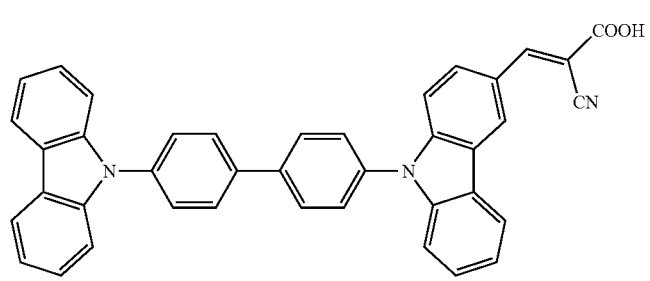
(212)
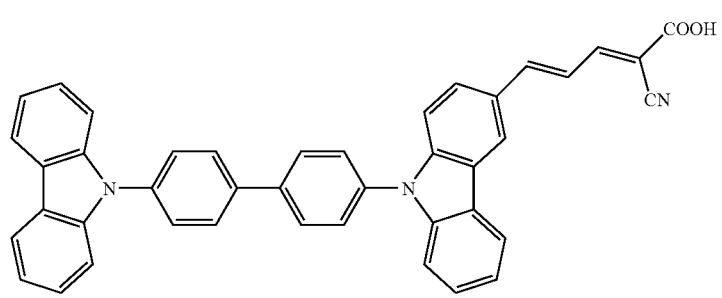
(213)

(215)
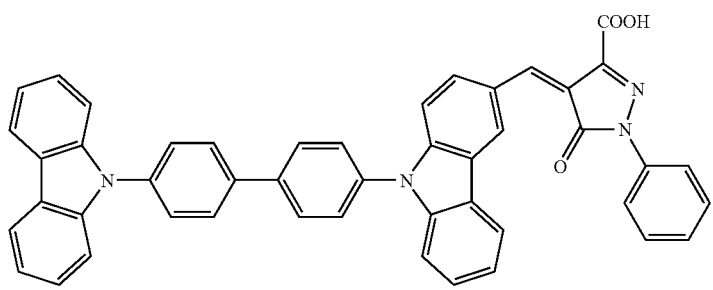
(215)
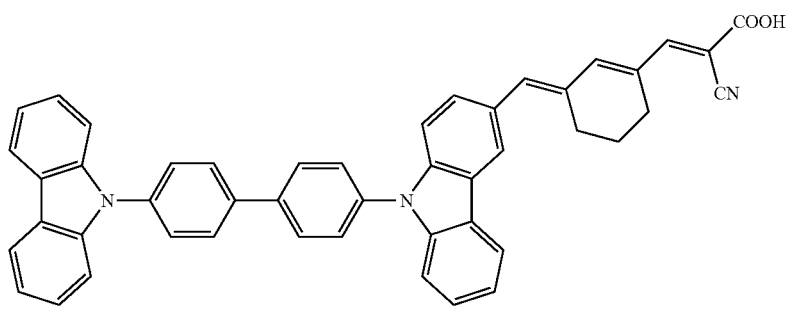
(216)
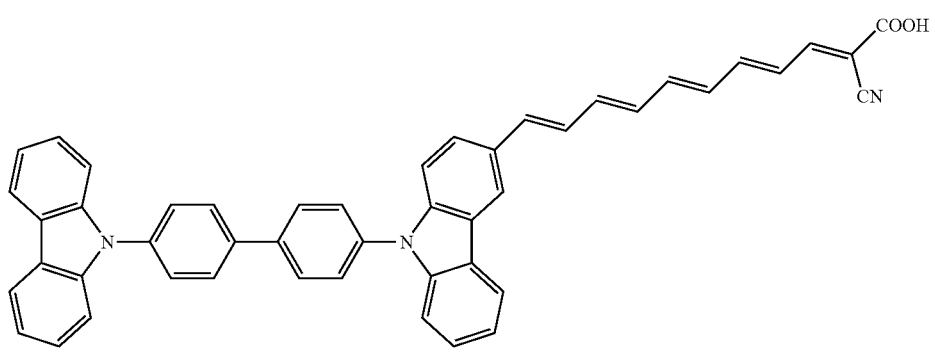
(KA 21)
(217)
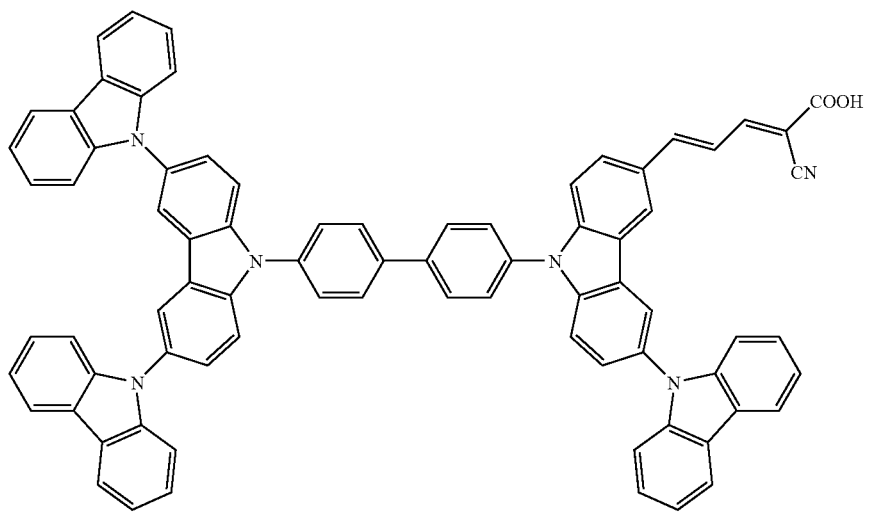

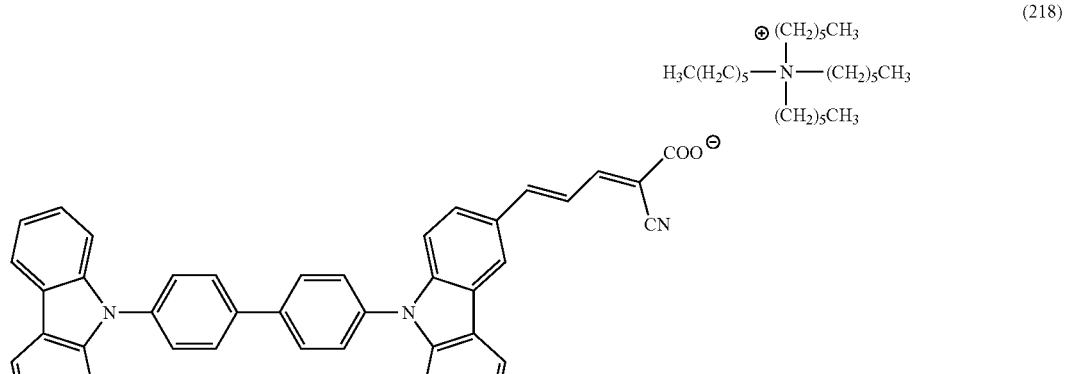
(218)
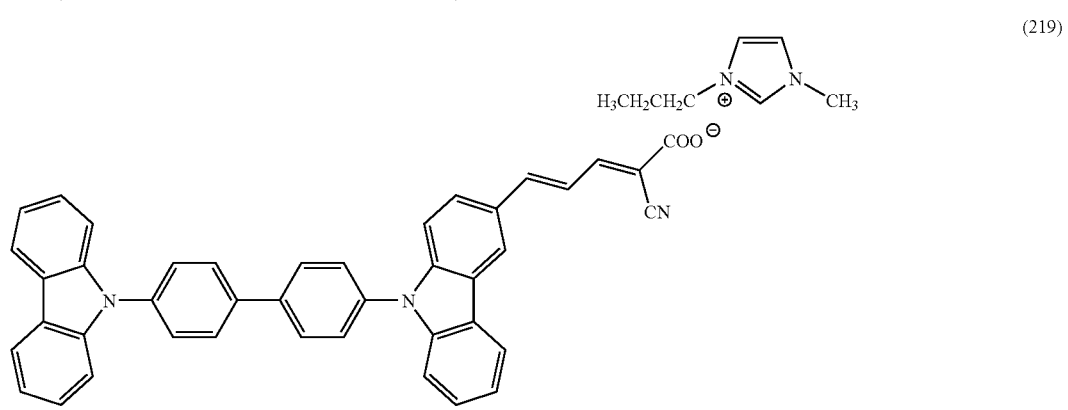
(219)
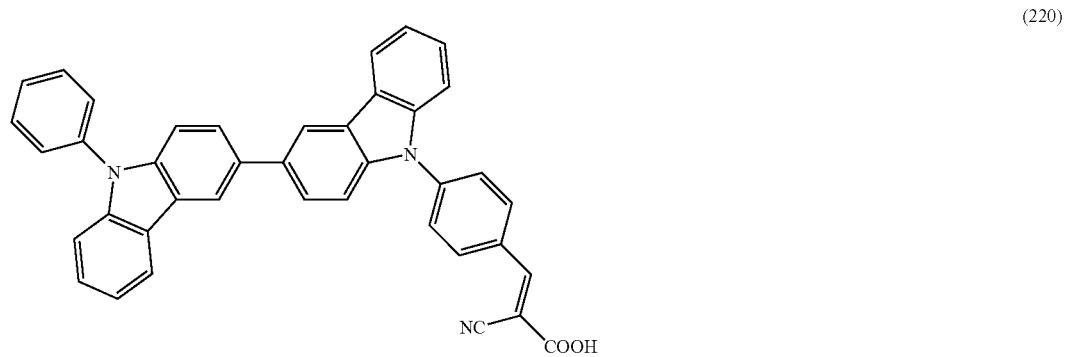
(220)
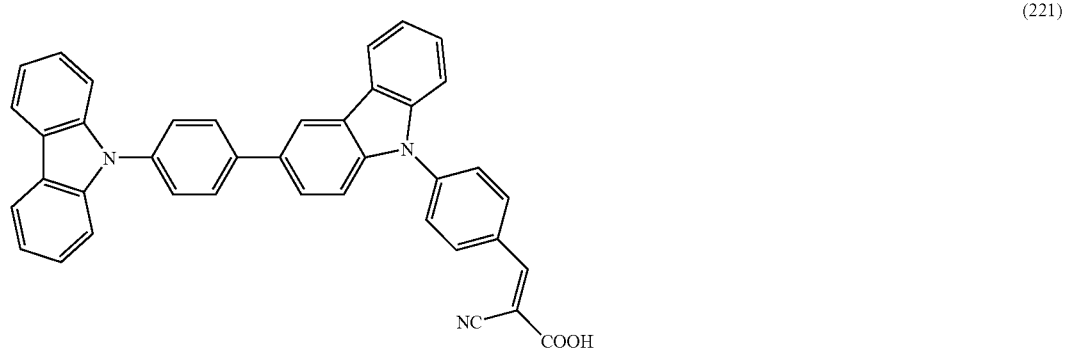
(221)

(222)
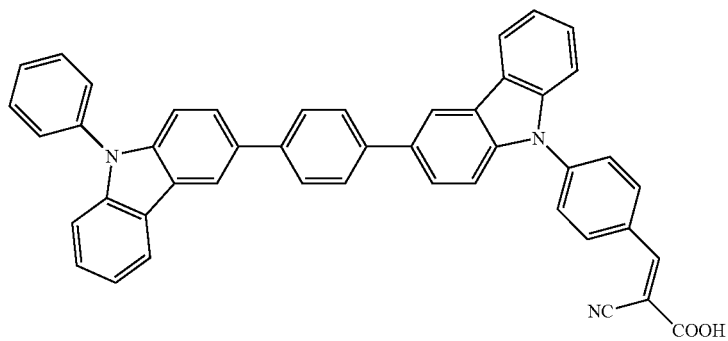
(223)
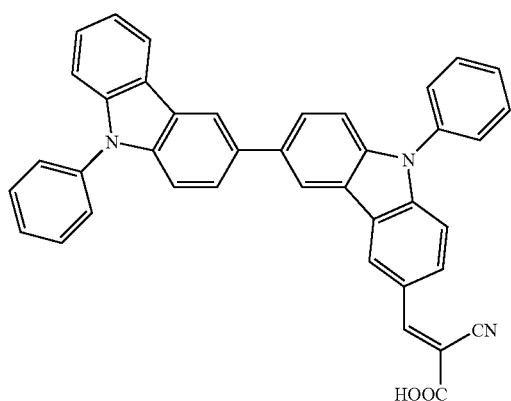
(K 22a)
(224)
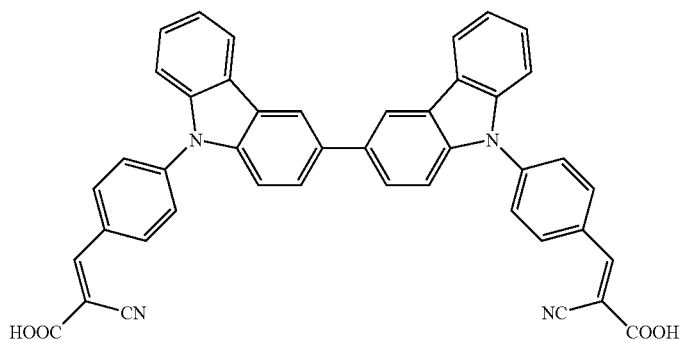
(225)
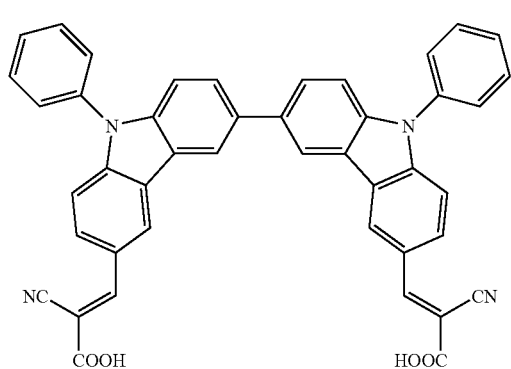

(226)
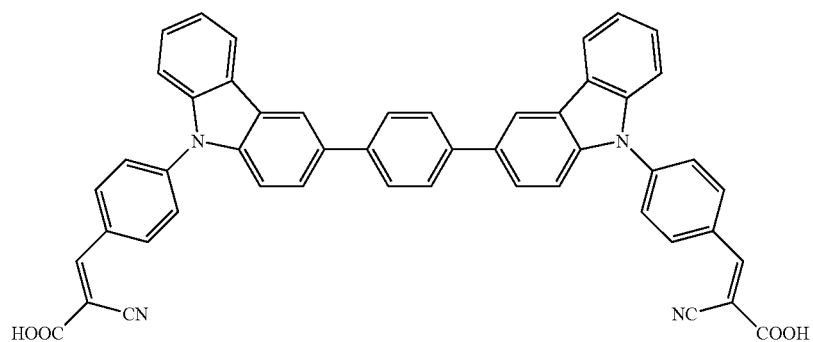
(227)
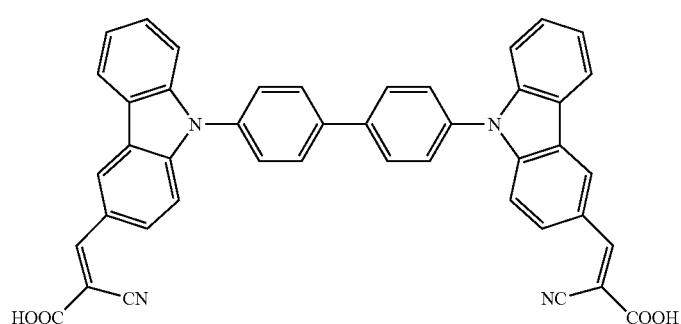
(228)
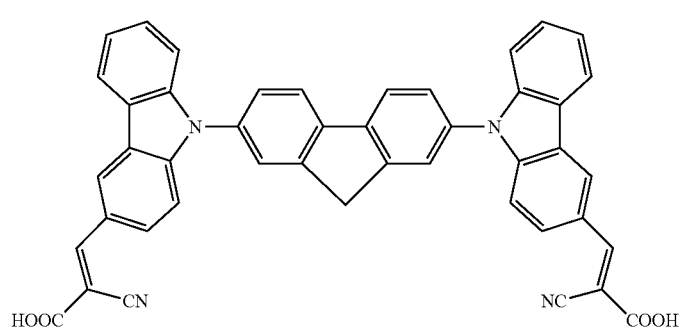
(229)
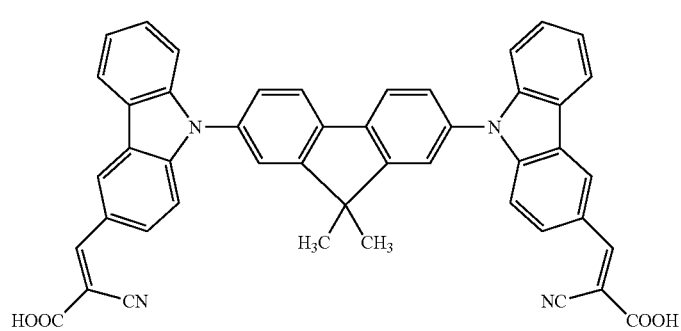

-continued
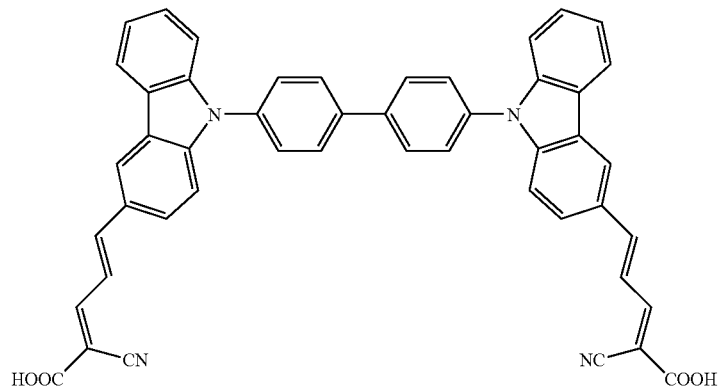
(230)
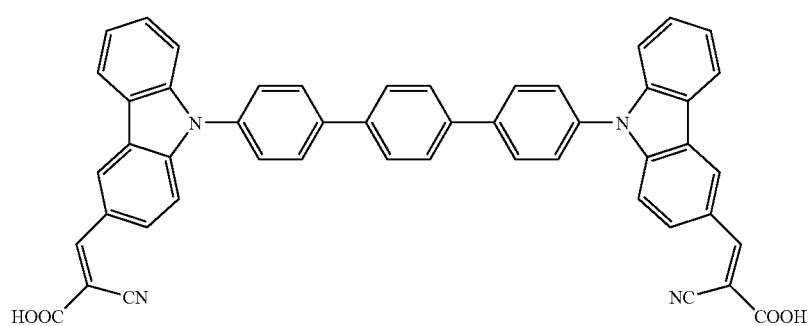
(231)
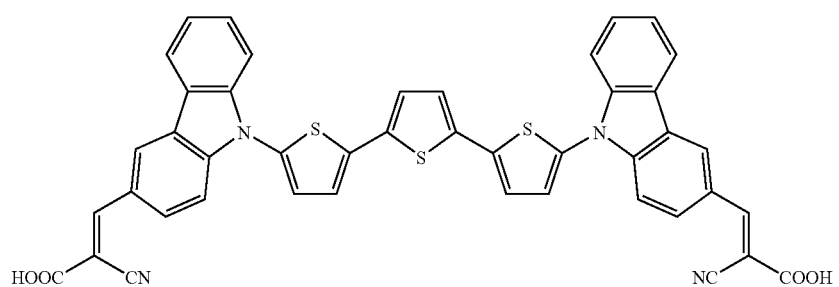
(232)
(KA 22b)
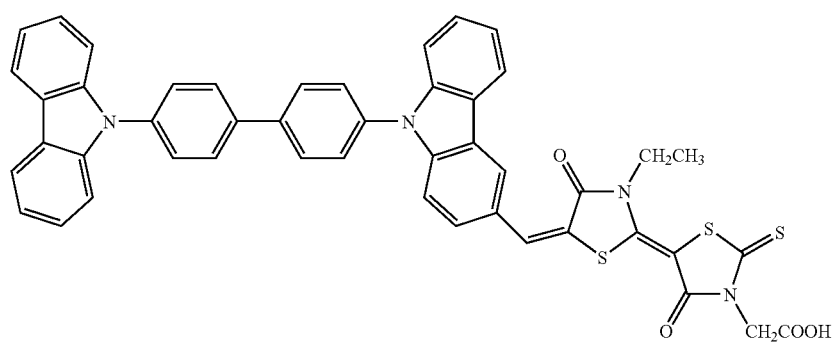
(233)

(234)
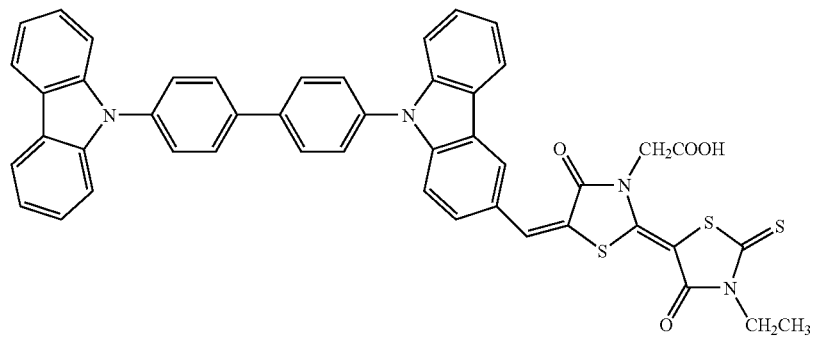
(235)
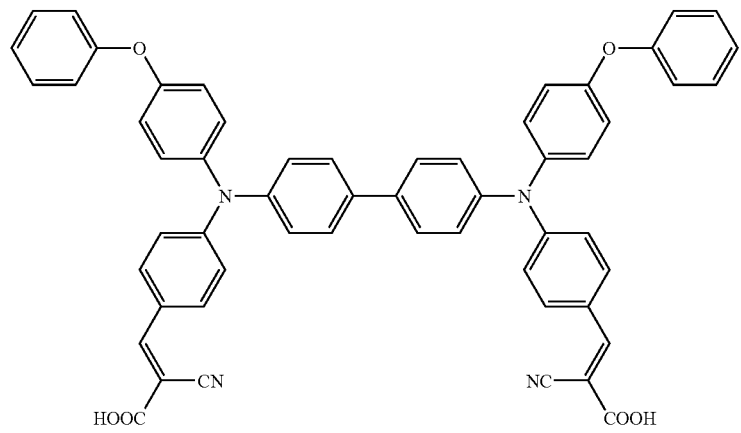
(236)
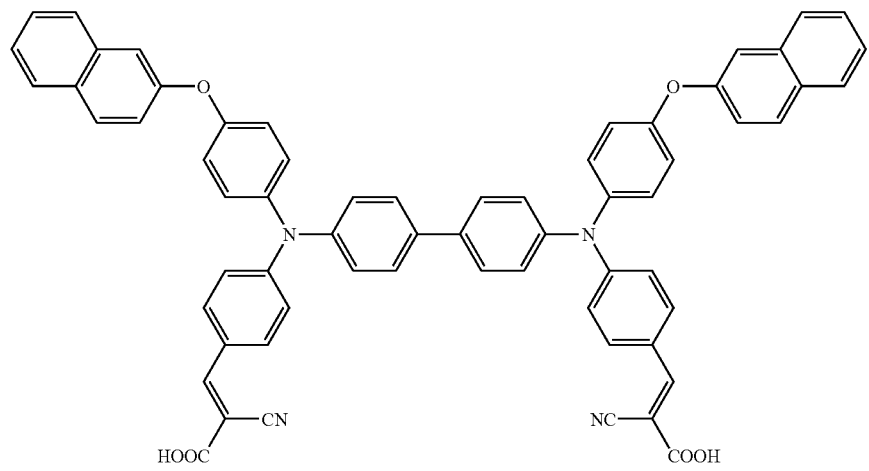
(237)
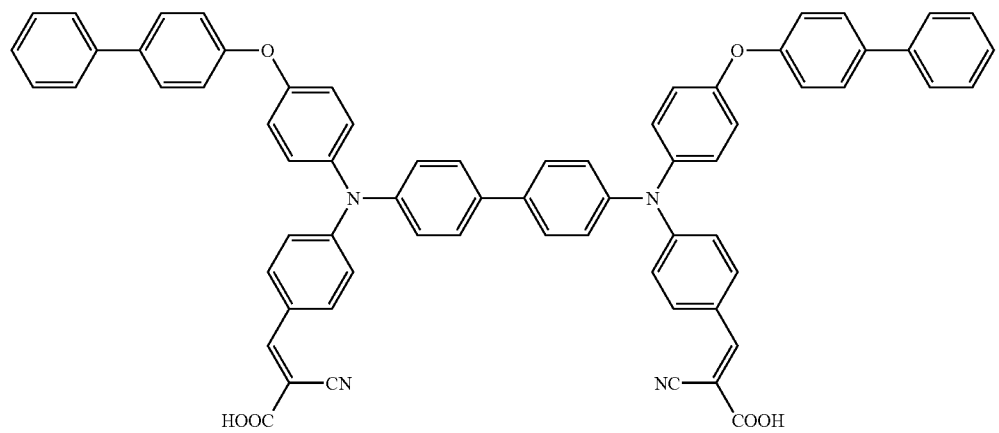

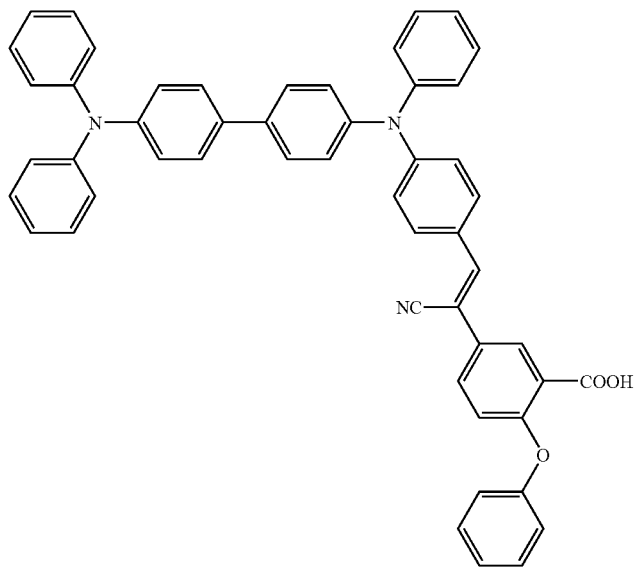

(238)

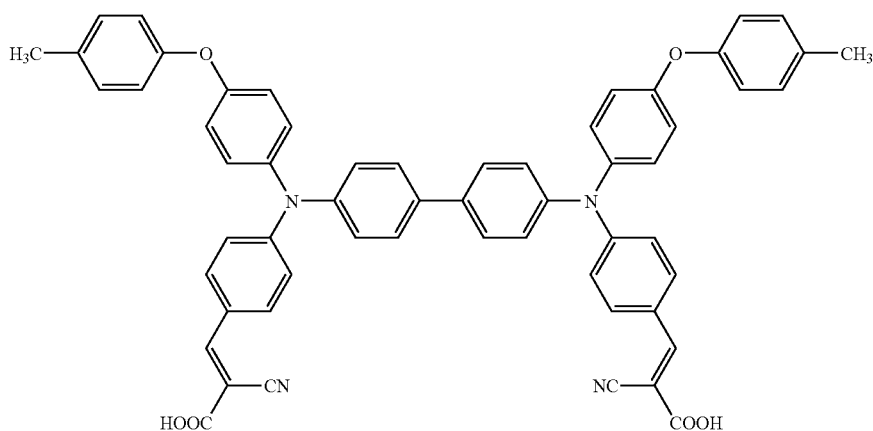

(239)

The dye-sensitized photoelectric conversion devices of the present invention are obtained, for example, by forming a thin film (a thin film of an oxide semiconductor) with oxide semiconductor particles on a substrate, subsequently supporting the methine dye represented by the Formula (1) on this thin film, and by dye-sensitizing. They usually have a substrate for photoelectric conversion devices and a thin film of oxide semiconductor particles sensitized with said methine dye, which is formed at the surface thereof.

As a substrate at which a thin film of an oxide semiconductor is mounted in the present invention, one with a conductive surface is preferable, and such a substrate is easily available on the market. Specifically, for example, those mounted with thin films of conductive metal oxides such as tin oxide doped with indium, fluorine or antimony, or a metal such as copper, silver, gold, and the like, mounted at the surface of glass or transparent polymer material such as polyethylene terephthalate or polyether sulfone can be used. Conductivity thereof may usually equal to or lower than 1000Ω, in particular, those having a conductivity of equal to or lower than 100Ω are preferable.

In addition, as oxide semiconductor particles, metal oxides are preferable, and specific examples thereof include oxides of such as titanium, tin, zinc, tungsten, zirconium, gallium, indium, yttrium, niobium, tantalum, vanadium and the like. Among these, oxides of titanium, tin, zinc, niobium, indium and the like are preferable, as specific examples of these oxides, titanium oxide, zinc oxide and tin oxide are included, and titanium dioxide, zinc oxide or tin oxide is preferably used in the present invention. These oxide semiconductors may be used alone, and they may be used by mixing or by coating on the surface of a semiconductor. In addition, average particle diameter of oxide semiconductor particles is usually 1 to 500 nm, and preferably 1 to 100 nm. In addition, these oxide semiconductor particles may also be used by mixing or in multi-layer of those with large particle diameter and those with small particle diameter.

The oxide semiconductor thin film can be produced by a method for directly forming a thin film at a substrate by spraying oxide semiconductor particles or the like, a method for electrically depositing a thin film of semiconductor particles at a substrate as an electrode, and a method for coating slurry of semiconductor particles or paste containing fine particles obtainable by hydrolysis of precursors of semiconductor particles of semiconductor alkoxides and the like, followed by drying, hardening, firing or the like. Among these methods, a method for using slurry is preferable in view of performance of an oxide semiconductor electrode. In the case of this method, slurry is obtained by dispersing oxide semiconductor particles in secondary aggregation state in a dispersing medium by a known method itself, so that average primary particle diameter becomes 1 to 200 nm.

As the dispersing medium for dispersing the slurry, any one may be used as long as it is capable of dispersing semiconductor particles; and water, alcohols like ethanol, ketones such as acetone and acetylacetone, or hydrocarbons like hexane are used; they may be used by mixing, and use of water is preferable in view of reducing slurry viscosity variation. In addition, a dispersion stabilizer may be used to stabilize dispersion state of oxide semiconductor particles. An example of a dispersion stabilizer to be used includes, for examples, acids such as acetic acid, hydrochloric acid, nitric acid; acetylacetone; acrylic acid; polyethylene glycol; polyvinyl alcohol and the like.

A substrate coated with the slurry may be fired, the firing temperature is usually equal to or higher than 100° C., preferably equal to or higher than 200° C.; the upper limit is generally equal to or lower than melting point (softening point) of a substrate, and usually the upper limit is 900° C., preferably equal to or lower than 600° C. In addition, firing time is not especially limited and generally within 4 hours is preferable. Thickness of the thin film on a substrate is usually 1 to 200 μm, and preferable 1 to 50 μm.

The oxide semiconductor thin film may be subjected to secondary treatment. Namely, for example, by directly immersing a whole substrate mounted with the semiconductor thin film, in a solution of an alkoxide, a chloride, a nitrate, a sulfate or the like of the same metal as a semiconductor, followed by drying or re-firing, performance of the semiconductor thin film can also be improved. As the metal alkoxide, for example, a metal (C1 to C4) alkoxide, more specifically, titanium ethoxide, titanium isopropoxide, titanium t-butoxide, n-dibutyl-diacetyl tin or the like is included; an alcohol solution thereof can be used. As the chloride, for example, titanium tetrachloride, tin tetrachloride, zinc chloride or the like is included; an aqueous solution thereof can be used. The resultant oxide semiconductor thin film is composed of oxide semiconductor particles.

Next, a method for supporting the methine dye on the oxide semiconductor thin film is explained.

As a method for supporting the methine dye represented by the above-described Formula (1), a method for immersing a substrate mounted with a thin film of the above-described oxide semiconductor, in a solution obtained by dissolving a dye in a solvent which can dissolve said dye, or in a dispersion solution dispersed with a dye in a solvent, in the case where a dye has low solubility, is included. Concentration in a solution or in a dispersion solution is determined depending on the methine dye. The semiconductor thin film formed at the substrate is immersed in this solution. Immersing temperature is generally from room temperature to boiling temperature of the solvent; immersing time is from about 1 minute to 48 hours. A specific example of a solvent to be used for dissolving the methine dye includes, for example, methanol, ethanol, acetonitrile, dimethylsulfoxide, dimethylformamide, acetone, t-butanol or the like. Dye concentration in the solution is usually $1 \times 10^{-6}$ M to 1 M, and preferably $1 \times 10^{-5}$ M to $1 \times 10^{-1}$ M. By the method as described above, dye-sensitized photoelectric conversion devices of the present invention having a thin film of oxide semiconductor particles sensitized with the methine dye is obtained.

The methine dye represented by the above-described Formula (1) to be supported, may be a single kind, or a mixture of several kinds. In addition, in the case of mixing, the methine dyes represented by the Formula (1) themselves, or other organic dyes or metal complex dyes may be mixed. In particular, by mixing dyes with different absorption wavelength, wider range of absorption wavelength can be utilized, which provides solar cells with high conversion efficiency. Examples of the metal complex dyes which may be mixed are not especially limited and ruthenium complexes, or quaternary salts thereof, phthalocyanine, porphyrin and the like shown in Non-Patent Literature 2 are preferable; the organic dyes which may be mixed and utilized include methine dyes (for example, metal free phthalocyanine, porphyrin and cyanin, melocyanine, oxonol, triphenylmethane type, acrylic acid-based dyes shown in Patent Literature 2), and/or dyes such as xanthene type, azo type, anthraquinone type, and perylene type and the like. Preferable ones include ruthenium complex dyes, melocyanine or acrylic acid-based methine dyes, and the like. In the case where 2 or more kinds of dyes are used, these dyes may sequentially be adsorbed at the semiconductor thin film or may be adsorbed after mixing and dissolving.

Ratio of dyes to be mixed is not especially limited, and optimal concentration is selected depending on each dye, however, in general, use of from equimolar mixing to about 10% by mole per dye is preferable. In the case where a dye is adsorbed at a thin film of oxide semiconductor particles, using a solution mixed and dissolved or dispersed with a mixture dye, total concentration of the dyes in the solution is the same as in supporting only a single kind. As a solvent in the case of using dyes by mixing, solvents as described above can be used, and the solvents for each dye to be used may be the same or different.

To prevent association of the dyes themselves in supporting the dyes at a thin film of oxide semiconductor particles, supporting the dyes in the co-presence of a clathrate compound is effective. Specific examples of a clathrate compounds which may be used here, include steroid-based compounds such as cholic acid, crown ether, cyclodextrin, calixarene, polyethylene oxide, and the like. Preferable ones include cholic acids such as deoxycholic acid, dehydrodeoxycholic acid, chenodeoxycholic acid, methyl cholate, and sodium cholate; polyethylene oxide; and the like. In addition, the surface of a semiconductor electrode may be treated with an amine, like 4-tert-butylpyridine and the like, after the dye is supported. As the method for treatment, for example, a method is adopted for immersing a substrate mounted with a thin film of semiconductor particles supporting a dye in an ethanol solution of said amine.

Solar cells of the present invention are configured by an electrode for the above-described photoelectric conversion devices wherein a dye is supported on the thin film of the oxide semiconductor; a counter electrode; a redox electrolyte, positive hole transportation material or a p-type semiconductor; and the like. As the form of the redox electrolyte, the positive hole transportation material, the p-type semiconductor and the like, liquid, coagulated substances (gel and gel state), solids and the like are included. As liquid-state ones, those each dissolved with the redox electrolyte, a molten salt, the positive hole transportation material, the p-type semiconductor and the like in a solvent, and ambient temperature molten salts are included; the coagulated substances (gel and gel state) include those containing these in a polymer matrix or low molecular weight gelling agent and the like. As solids-state ones, the redox electrolyte, the molten salts, the positive hole transportation material, the p-type semiconductor and the like may be used. As the positive hole transportation material, amine derivatives; conductive polymers such as polyacetylene, polyaniline, and polythiophene; discotic liquid crystal materials such as triphenylene-based compounds or the like is included. In addition, as the p-type semiconductor, CuI, CuSCN or the like is included.

As the counter electrode, one having conductivity and one acting catalytically in a reduction reaction of the redox electrolyte is preferable. For example, glass or polymer films vapor-deposited with such as platinum, carbon, rhodium, and ruthenium, or coated with conductive fine particles and the like may be used.

As the redox electrolyte used in solar cells of the present invention, halogen redox electrolytes composing of halogen compounds having a halogen ion as a counter ion and halogen molecules; metal redox electrolytes of a metal complex such as ferrocyanide salt-ferricyanide salt, a ferrocene-ferricinium ion, and a cobalt complex; organic redox electrolytes such as an alkyl thiol-alkyl disulfide, viologen dyes, and hydroquinone-quinone; and the like are included, however, halogen redox electrolytes are preferable. As the halogen molecule in the halogen redox electrolytes composed of a halogen compound—a halogen molecule, for example, an iodine molecule and a bromine molecule are included, an iodine molecule is preferable. In addition, as the halogen compound having a halogen ion as a counter ion, for example, metallic halides such as LiBr, NaBr, KBr, LiI, NaI, KI, CsI, $CaI_2$, $MgI_2$, and CuI; and organic quaternary ammonium halides such as tetraalkyl ammonium iodide, imidazolium iodide, pyridinium iodide and the like are included, and, salts with an iodine ion as a counter ion are preferable. In addition, other than the above-described iodine ion, use of an electrolyte with an imide ion such as a bis(trifluoromethanesulfonyl)imide ion, a dicyanoimide ion as a counter ion is also preferable.

In addition, in the case where the redox electrolyte is configured by a form of a solution containing the same, electrically inert one is used as the solvent. For example, acetonitrile, propylene carbonate, ethylene carbonate, 3-methoxypropionitrile, methoxyacetonitrile, ethylene glycol, propylene glycol, diethylene glycol, triethylene glycol, γ-butyrolactone, dimethoxyethane, diethyl carbonate, diethyl ether, diethyl carbonate, dimethyl carbonate, 1,2-dimethoxyethane, dimethylformamide, dimethylsulfoxide, 1,3-dioxolane, methyl formate, 2-methyltetrahydrofuran, 3-methoxyoxaziridine-2-one, sulfolane, tetrahydrofuran, water and the like are included; among these, in particular, acetonitrile, propylene carbonate, ethylene carbonate, 3-methoxypropionitrile, methoxyacetonitrile, ethylene glycol, 3-methoxyoxaziridine-2-one, γ-butyrolactone and the like are preferable. These solvents may be used alone or as a mixture of 2 or more kinds. In the case of a gel-state electrolyte, matrix such as an oligomer or a polymer containing an electrolyte or an electrolyte solution, and a low molecular weight gelling agent similarly containing an electrolyte or an electrolyte solution, described in Non-Patent Literature 3, are included. Concentration of the redox electrolyte is usually 0.01 to 99% by weight, and preferably about 0.1 to 90% by weight.

In solar cells of the present invention, a counter electrode is arranged so as to sandwich the thin film of the oxide semiconductor with an electrode for photoelectric conversion devices, wherein a dye is supported on said film at a substrate. By filling a solution containing the redox electrolyte in the space thereof, the solar cells can be obtained.

The present invention is further specifically explained below based on synthesis examples and examples, however, the present invention is by no means limited by these synthesis examples and examples. In the examples, parts and % represent parts by mass, unless otherwise specified, and % by weight, respectively.

SYNTHESIS EXAMPLE 1

Into 20 parts of ethanol, 5 parts of the compound (240) to be described below and 4.2 parts of methyl cyanoacetate were dissolved, and 0.05 parts of anhydrous piperazine was added thereto. After subjecting the solution to a reaction for 2 hours under reflux, it was cooled to separate out orange crystal, which was filtered, washed with water and dried. The resultant crystal was added into 50 ml of an ethanol solution of 5% potassium hydroxide, and subjected to a reaction for 1 hour under reflux. The reaction solution was poured into 100 ml of water, and further an aqueous solution of 10% hydrochloric acid was added until pH became 6. The separated-out crystal was filtered, washed with water, dried and purified with column chromatography. By further recrystallization from chloroform, 5.3 parts of the compound (21) was obtained as orange crystal.

λMax (EtOH: 402 nm)

1H-NMR (PPM:d6-DMSO): 6.94 (d.arom.2H), 7.06 (m.arom.8H), 7.23 (m.arom.5H), 7.34 (t.arom.4H), 7.44 (t.arom.2H), 7.60 (d.arom.2H), 7.67 (d.arom.2H), 7.90 (d.arom.2H), 8.06 (s.-CH=.1H)

(KA 23)

(240)

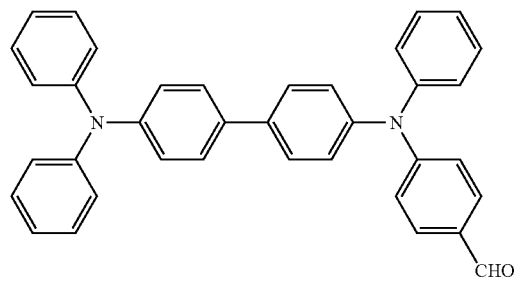

In this connection, the above-described compound (240) was synthesized as follows:

A mixed solution of 5 parts of chloroform and 10 parts of DMF (dimethylformamide) was stirred, and 1 part of phosphorus oxychloride was added thereto while maintaining the temperature at 5° C. The solution was stirred at normal temperature (25° C.) for 30 minutes, and 2 parts of N,N,N',N'-tetraphenylbenzidine was added and stirred for 1 hour. Temperature of the reaction solution was raised to 70° C. and the solution was further stirred for 1 hour. The reaction solution was cooled to room temperature, and 100 parts of an aqueous solution of 5% sodium hydroxide was added, and extracted with 200 parts of ethyl acetate. The ethyl acetate phase was dried by magnesium sulfate and filtered to yield a yellow tar-like component after removal of ethyl acetate. This tar-like component was separated and purified with column chromatography (hexane:ethyl acetate=10:1) and further recrystallized from chloroform to yield 1.2 parts of the compound (240).

SYNTHESIS EXAMPLE 2

By similar processing as in Synthesis Example 1 except that 5.2 parts of the compound (241) to be described below was used instead of the compound (240) in Synthesis Example 1, 7 parts of the compound (128) was obtained as orange crystal.

λmax (EtOH: 422 nm)

(KA 24)

(241)

(KA 25)

(242)

(243)

SYNTHESIS EXAMPLE 3

Synthesis of the Compound (168)

Into 20 parts of ethanol, 5 parts of the compound (241) and 4.2 parts of rhodanine-3-acetic acid were added, and 0.05 parts of anhydrous piperazine was added thereto. After subjecting the solution to a reaction for 2 hours under reflux, it was cooled to separate out an orange crystal, which was filtered, and washed with water. By further recrystallization from ethanol, 6.3 parts of the compound (168) was obtained as orange brown crystal.

λmax (EtOH: 496 nm)

SYNTHESIS EXAMPLE 4

Synthesis of the Compound (213)

A mixed solution of 20 parts of chloroform and 1 part of 3-(dimethylamino)acrolein was stirred, and 1.8 parts of phosphorus oxychloride was added thereto while maintaining the temperature at 5° C. The solution was then stirred at normal temperature (25° C.) for 30 minutes, and 5 parts of the compound (242) (biphenyl-4,4'-bicarbazol) to be described below was added and stirred for further 1 hour. The reaction solution was heated to 70° C. and stirred for 1 hour. The reaction solution was cooled to room temperature, and 100 parts of an aqueous solution of 5% sodium hydroxide was added, and extracted with 200 parts of ethyl acetate. The ethyl acetate phase was dried by magnesium sulfate and filtered to yield brownish-red tar-like component after removal of ethyl acetate. This tar-like component was separated and purified with column chromatography (hexane:ethyl acetate=10:1) and further recrystallized from ethanol to yield 4.2 parts of the compound (243). Then, into 20 parts of ethanol, 1 part of the compound (243) and 0.28 part of methyl cyanoacetate were dissolved, and 0.1 part of piperidine was added thereto and heated under reflux for 1 hour. The separated-out crystal was filtered to yield 1 part of orange crystal; 1 part of this orange crystal was dissolved into 50 parts of an ethanol solution of 5% sodium hydroxide and heated under reflux for 1 hour. The reaction solution was added into 100 parts of water, and further neutralized with an aqueous solution of 10% hydrochloric acid. The separated-out crystal was recrystallized from ethanol to yield 0.5 part of the compound (213) as orange crystal.

Maximum absorption wave length (λmax): 439 nm (Ethanol)

(213)

SYNTHESIS EXAMPLE 5

Synthesis of the Compound (214)

While maintaining 20 parts of DMF at 5° C., 1.8 parts of phosphorus oxychloride was added. Then, the solution was stirred at room temperature (25° C.) for 30 minutes, 5 parts of the above-described compound (242) was added thereto and further stirred for 1 hour. The reaction solution was heated to 70° C. and stirred for 1 hour. The reaction solution was cooled to room temperature, and 100 parts of an aqueous solution of 5% sodium hydroxide was added, and extracted with 200 parts of ethyl acetate. The ethyl acetate phase was dried by magnesium sulfate and filtered to yield yellow tar-like component after removal of ethyl acetate. This tar-like component was separated and purified with column chromatography (hexane:ethyl acetate=10:1) and further recrystallized from ethanol to yield 4.7 parts of the compound (245). Then, into 50 parts of ethanol, 1 part of the compound (245) and 0.4 part of the compound (246) (1-phenyl-3-carboxy-5-pyrazolone) to be described below were dissolved, and heated under reflux for 1 hour. The resultant crystal was recrystallized from ethanol to yield 0.5 part of the compound (214) as red purple crystal.

Maximum absorption wave length (λmax): 529 nm (Ethanol)

(KA 26)

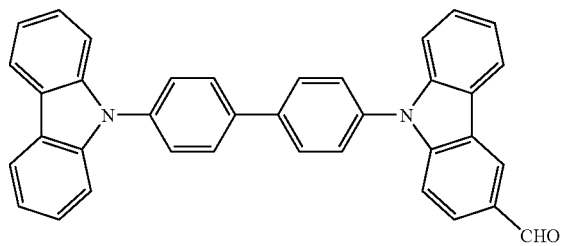
(245)

(KA 27)

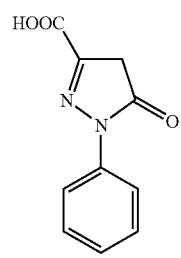
(246)

EXAMPLE 1

The dye of compound No. 21 was dissolved in EtOH so as to be $3.2 \times 10^{-4}$ M. A porous substrate (a semiconductor thin film electrode prepared by sintering porous titanium oxide at a transparent conductive glass electrode at 450° C. for 30 minutes) was immersed in this solution at 25° C. for 12 hours to support the dye, washed with a solvent, and dried to yield photoelectric conversion devices of the dye-sensitized semiconductor thin film. The photoelectric conversion devices were fixed so that the semiconductor thin film was arranged at the inner side, and were faced to the conductive glass sputtered with platinum at the surface, and a space for filling an electrolyte solution is formed therebetween, and then a solution containing the electrolyte was poured into the space to prepare solar cells.

As the electrolyte solution, 3-methoxypropionitrile dissolved with iodine/lithium iodide/1,2-dimethyl-3-n-propylimidazolium iodide/t-butylpyridine in the ratio of 0.1 M/0.1 M/0.6 M/1 M, respectively was used.

EXAMPLE 2

A semiconductor thin film electrode treated with titanium tetrachloride was obtained by dropping an aqueous solution of 0.2 M titanium tetrachloride onto a titanium oxide thin film portion of the semiconductor thin film electrode, subjecting the solution to stand still at room temperature for 24 hours, washing with water and firing again at 450° C. for 30 minutes. Said semiconductor thin film electrode was treated in the same way as in Example 1 to yield photoelectric conversion devices of the semiconductor thin film sensitized with the dye of compound No. 21, and solar cells were prepared in the same way in Example 1 hereafter.

EXAMPLE 3

Photoelectric conversion devices having the dye-sensitized semiconductor thin film treated with cholic acid was obtained by making the semiconductor thin film to support the dye, in the same way in Example 1 except that a solution of the dye of compound No. 21 was prepared by adding cholic acid as a clathrate compound so as to be $3 \times 10^{-2}$ M, and said solution was used, in the step for supporting the dye. In addition, solar cells were prepared in the same way in Example 1 hereafter.

EXAMPLE 4

Dye-sensitized photoelectric conversion devices and solar cells were prepared in the same way in Example 2 except that a dye used was replaced to the dye of compound No. 94.

EXAMPLE 5

Dye-sensitized photoelectric conversion devices and solar cells were prepared in the same way as in Example 1 except that a dye used was replaced to the dye of compound No. 128.

EXAMPLE 6

Dye-sensitized photoelectric conversion devices and solar cells were prepared in the same way as in Example 1 except that a dye used was replaced to the dye of compound No. 168.

EXAMPLE 7

A semiconductor thin film electrode treated with titanium tetrachloride was obtained in the same way as in Example 2, and dye-sensitized photoelectric conversion devices and solar cells were prepared in the same way as in Example 2 except that a dye used was replaced to the dye compound No. 213.

EXAMPLE 8

Dye-sensitized photoelectric conversion devices and solar cells were prepared in the same way as in Example 1 except that a dye used was replaced to the dye compound No. 214.

EXAMPLE 9

Dye-sensitized photoelectric conversion devices and solar cells were prepared in the same way as in Example 1 except that a dye used was replaced to the dye of compound No. 227.

EXAMPLE 10

Dye-sensitized photoelectric conversion devices and solar cells were prepared in the same way as in Example 1 except that 2 kinds of the dyes of compound No. 21 and 128 were used; an EtOH solution was adjusted so as to be $1.6 \times 10^{-4}$ M for each of the 2 kinds of dyes, and the 2 kinds of dyes were supported.

A TEST EXAMPLE

On solar cells obtained in the above-described Examples, performances thereof were measured as follows:

Size of the cells for measurement was set to 0.25 cm² as an effective area. A 500-W xenon lamp was used as light source, and was adjusted to 100 W/cm² after passing through a filter having AM (air mass passing atmosphere) of 1.5. Short circuit current, open voltage and conversion efficiency were measured using a potentio-galvanostat; the results are shown in Table 5.

TABLE 5

| Example | Compound No. | Short-circuit Current (mA/cm²) | Open voltage (V) | Conversion efficiency (%) | TiCl₄ treatment of thin film | Presence/Absence of choric acid |
|---|---|---|---|---|---|---|
| 1 | 21 | 10.5 | 0.65 | 4.9 | NO | absent |
| 2 | 21 | 10.7 | 0.66 | 5.1 | YES | absent |
| 3 | 21 | 10.1 | 0.66 | 5.0 | NO | present |
| 4 | 94 | 11.8 | 0.64 | 5.6 | YES | absent |
| 5 | 128 | 9.6 | 0.64 | 4.1 | NO | absent |
| 6 | 168 | 7.6 | 0.59 | 3.4 | NO | absent |
| 7 | 213 | 12.0 | 0.66 | 5.9 | YES | absent |
| 8 | 214 | 8.1 | 0.60 | 3.5 | NO | absent |
| 9 | 227 | 9.5 | 0.65 | 4.5 | NO | absent |
| 10 | 21 + 128 | 10.7 | 0.65 | 5.2 | NO | absent |

It is clear from Table 5 that visible light can effectively be converted to electricity by using photoelectric conversion devices sensitized with the methine dye represented by the Formula (1).

INDUSTRIAL APPLICABILITY

Dye-sensitized photoelectric conversion devices of the present invention are capable of exerting dye sensitization stably and in high conversion efficiency, and thus production of solar cells using low cost dye-sensitized photoelectric conversion devices has become possible.

The invention claimed is:

1. A photoelectric conversion device, comprising oxide semiconductor particles sensitized with a methine dye represented by the Formula (1):

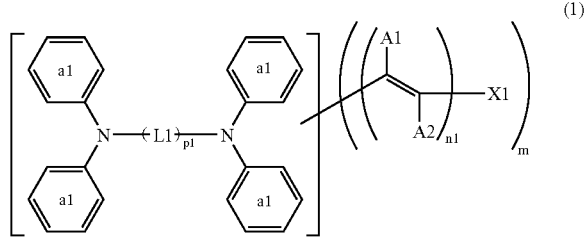

in the Formula (1), m is an integer of 1 to 4; n1 is an integer of 1 to 7; p1 is an integer of 1 to 4; X1 represents an optionally substituted aromatic residue; an optionally substituted aliphatic hydrocarbon residue; a cyano group; a phosphoric acid group; a sulfonic acid group; or a substituted carbonyl group selected from the group consisting a carboxyl group, a carbonamide group, an alkoxycarbonyl group and an acyl group; L1 is a group selected from the group consisting of the groups represented by the following Formulas:

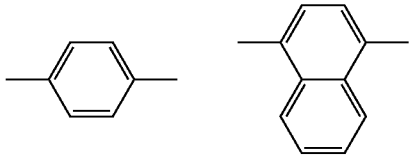

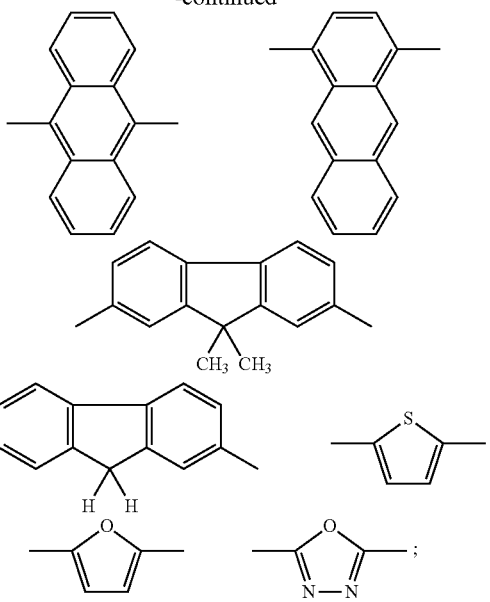

A1 and A2 each independently represent an optionally substituted aromatic residue, a hydroxyl group, a phosphoric acid group, a cyano group, a hydrogen atom, a halogen atom, an optionally substituted aliphatic hydrocarbon residue, a carboxyl group, a carbonamide group, an alkoxycarbonyl group or an acyl group; in the case where n1 is 2 or larger, and A1 and A2 are present in plural, each of A1 and each of A2 may be the same or different from each other, and wherein a ring may be formed by A1 and A2, by A1 and A1, or by A2 and A2, the resultant ring may optionally have a substituent;

X1 and A2 closest to X1 (A2 binding to the same carbon atom as the carbon atom which X1 is bound to) may form a ring;

in the 4 a1 rings, at least any one of the 4 a1 rings is substituted with the vinyl group enclosed by ( )m, and these a1 rings each independently may optionally have, as other substituents, 1 or 2 or more groups selected from the group consisting of a halogen atom, an amide group, a hydroxyl group, a cyano group, a nitro group, an alkoxyl group, an acyl group, a substituted or unsubstituted amino group, an optionally substituted aliphatic hydrocarbon residue and an optionally substituted aromatic residue and in the case where a plurality of said other substituents are present, these substituents may form a ring which may optionally have a substituent, by mutually binding themselves or with the adjacent ring a1 or L1.

2. The photoelectric conversion device according to claim 1, wherein the 4 a1 rings each independently represent unsubstituted benzene, or benzene rings substituted with a group selected from the group consisting of a halogen atom, a di(C1 to C4)alkylamino group, a phenyl group, a (C1 to C4) alkyl group, and a unsubstituted or methyl substituted (C6 to C12) aryloxy group, as a substituent; and the 2 a1 rings binding to the same nitrogen atom may form a carbazole ring by a single bond together with said nitrogen atom; and at least any one of the 4 a1 rings is substituted with the vinyl group enclosed by ( )m.

3. The photoelectric conversion device according to claim 1, wherein the 4 a1 rings are benzene rings which may optionally be substituted with a phenyl group, a methyl group or a dimethylamino group, n1 is 1 to 5, p1 is 1 to 4, L1 is a phenyl group, m is 1 or 2, and in the case where m is 2, a vinyl group enclosed by ( )m is, one by one, substituted with the a1 rings at both sides linked by -(L1)-.

4. The photoelectric conversion device according to claim 1, wherein X1 in the Formula (1) is a carboxyl group.

5. The photoelectric conversion device according to claim 1, 2 or 3, wherein X1 in the Formula (1) is a carboxyl group, and A2 closest to X1 is a cyano group, a carboxyl group or an acyl group.

6. The photoelectric conversion device according to claim 1, wherein X1 in the Formula (1) and A2 closest to X1 form an optionally substituted ring.

7. The photoelectric conversion device according to claim 6, wherein p1 in the Formula (1) is 1 to 2.

8. The photoelectric conversion device according to claim 6, wherein m in the Formula (1) is 1 to 2.

9. The photoelectric conversion device according to claim 6, wherein n1 in the Formula (1) is 1 to 5.

10. The photoelectric conversion device according to claim 1, wherein the methine dye represented by the Formula (1) in claim 1 is the methine dye represented by the Formula (2):

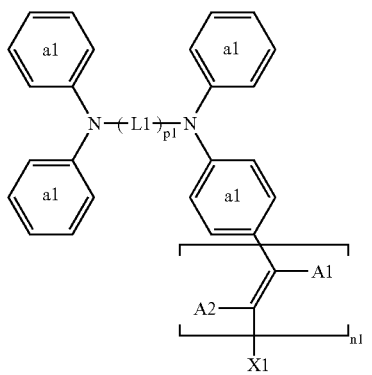

in the Formula (2), n1, p1, L1, X1, A1, A2 and ring a1 each represent the same meanings as in the Formula (1).

11. The photoelectric conversion device according to claim 1, wherein the methine dye represented by the Formula (1) in claim 1 is the methine dye represented by the Formula (3):

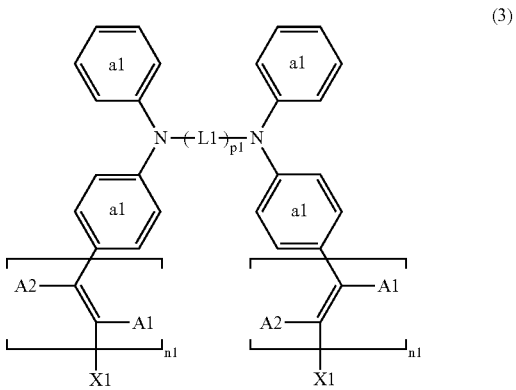

in the Formula (3), n1, p1, L1, X1, A1, A2 and ring a1 each represent the same meanings as in the Formula (1).

12. The photoelectric conversion device according to claim 1, further comprising a metal complex and/or an organic dye having structure other than the Formula (1).

13. The photoelectric conversion device according to claim 1, wherein the oxide semiconductor particles contain titanium dioxide, zinc oxide or tin oxide, as a metal component.

14. The photoelectric conversion device according to claim 1, wherein the oxide semiconductor particles sensitized with the methine dye are those obtainable by making the oxide semiconductor particles to support the methine dye represented by the Formula (1), in the presence of a clathrate compound.

15. The photoelectric conversion device according to claim 1, wherein the oxide semiconductor particles sensitized with the methine dye are those obtainable by making the thin film of the oxide semiconductor particles to support the dye.

16. The photoelectric conversion device according to claim 1, wherein, in the Formula (1), the 4 a1 rings each independently represent unsubstituted benzene rings, or benzene rings substituted with a group selected from the group consisting of a halogen atom, a di(C1 to C4)alkylamino group, a phenyl group, a (C1 to C4) alkyl group, and a unsubstituted or methyl substituted (C6 to C12) aryloxy group, as the substituent, and the 2 a1 rings binding to the same nitrogen atom may form a carbazole ring by a single bond together with said nitrogen atom, and at least any one of the 4 a1 rings is substituted with the vinyl group enclosed by ( )m, p1 is 1 or 2, n1 is 1 to 5, m is 1 or 2, A1 and A2 independently represent a hydrogen atom; a (C1 to C18) aliphatic hydrocarbon residue; a phenyl group; a hydroxy group; a mercapto group; an amino group which may optionally be substituted with a phenyl group; a carboxyl group; a cyano group; a (C2 to C4) acyl group which may optionally be substituted with 1 to 3 halogeno groups; or a nitro group, adjacent A1 and A2, or A1 and A1, which are adjacent with one space, or A2 and A2, which are adjacent with one space, may form a 5- to 6-membered condensed ring by linking together with the vinyl group, X1 represents a carboxyl group; a phosphoric acid group; a cyano group; a phenyl group having any of a hydroxy group or a carboxyl group, or both thereof, as a substituent; a 5- to 6-membered condensed ring containing 1 to 2 hetero atoms composing of an oxygen atom, a sulfur atom and a nitrogen atom, wherein said condensed ring may optionally be substituted with a carboxyl group, or a (C1 to C3) alkyl group which may optionally be substituted with a carboxyl group; in addition, said condensed ring may be a condensed ring containing 1 benzene ring; and further, A2 binding to the same carbon atom having X1 may bind with X1, and =C(A2)(X1) may be a 5- to 6-membered condensed ring which may optionally contain 1 to 2 hetero atoms selected from the group consisting of an oxygen atom, a sulfur atom and a nitrogen atom, wherein said condensed ring may optionally be substituted with an oxygen atom; a sulfur atom; a cyano group; a phenyl group; a carboxyl group; or a (C1 to C3) alkyl group which may optionally be substituted with a carboxyl group, and in addition, said condensed ring may be a condensed ring containing 1 benzene ring.

17. The photoelectric conversion device according to claim 16, wherein the 4 a1 rings each independently represent unsubstituted benzene rings, or benzene rings substituted with the vinyl group enclosed by ( )m, at least 1 of the a1 rings is substituted with said vinyl group; 2 a1 rings binding to the same nitrogen atom may form a carbazole ring by single bond together with said nitrogen atom, p1 is 2, L1 represents a phenylene group, n1 is 1 or 2, m is 1 or 2, A1 and A2 independently represent a hydrogen atom, a carboxyl group, and a cyano group, X1 represents a carboxyl group, and further A2 binds with X1 together, and =C(A2)(X1) is a group represented by the following Formula B17 or B21:

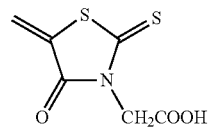

B17

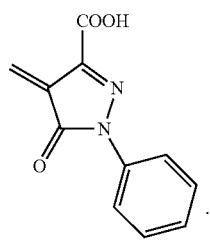

B21

* * * * *